US008569852B2

(12) United States Patent
Morise et al.

(10) Patent No.: US 8,569,852 B2
(45) Date of Patent: Oct. 29, 2013

(54) MAGNETIC OSCILLATION ELEMENT AND SPIN WAVE DEVICE

(75) Inventors: Hirofumi Morise, Kanagawa-ken (JP); Shiho Nakamura, Kanagawa-ken (JP); Tsuyoshi Kondo, Kanagawa-ken (JP); Yoshinari Kurosaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,631

(22) Filed: Sep. 21, 2011

(65) Prior Publication Data
US 2012/0242438 A1 Sep. 27, 2012

(30) Foreign Application Priority Data

Mar. 25, 2011 (JP) ................... 2011-068859

(51) Int. Cl.
*H01F 7/02* (2006.01)
*H01L 29/82* (2006.01)
*G11C 11/15* (2006.01)

(52) U.S. Cl.
USPC ........................... 257/421; 365/173; 335/306

(58) Field of Classification Search
USPC .................... 335/302–306; 257/421; 365/173
See application file for complete search history.

(56) References Cited

U.S. PATENT DOCUMENTS

| | | | |
|---|---|---|---|
| 6,920,065 B2 * | 7/2005 | Ohmori ........................ 365/173 |
| 7,038,942 B2 * | 5/2006 | Ohmori ........................ 365/173 |
| 7,230,265 B2 * | 6/2007 | Kaiser et al. ..................... 257/30 |
| 7,381,480 B2 * | 6/2008 | Nakamura et al. .......... 428/811.5 |
| 7,531,830 B2 * | 5/2009 | Kaiser et al. ..................... 257/30 |
| 8,045,366 B2 * | 10/2011 | Zheng et al. ................... 365/158 |
| 8,284,594 B2 * | 10/2012 | Hu et al. ........................ 365/158 |
| 2004/0136235 A1 * | 7/2004 | Ohmori ........................ 365/173 |
| 2005/0184839 A1 * | 8/2005 | Nguyen et al. ................. 335/173 |
| 2005/0226043 A1 * | 10/2005 | Parkin et al. ................... 365/173 |
| 2005/0248981 A1 * | 11/2005 | Ohmori ........................ 365/173 |

(Continued)

FOREIGN PATENT DOCUMENTS

JP 2006-295908 10/2006
JP 2009-027704 2/2009

(Continued)

OTHER PUBLICATIONS

Rippard, et al. Direct-Current Induced Dynamics in Co90Fe10/Ni80Fe20 Point Contacts, Physical Review Letters, vol. 92, No. 2, 2004.
Japanese Office Action dated Mar. 18, 2013 for Japanese Patent App. No. 2011-068859, 8 pages.

*Primary Examiner* — Alexander Talpalatski
(74) *Attorney, Agent, or Firm* — Turocy & Watson, LLP

(57) ABSTRACT

According to one embodiment, a magnetic oscillation element includes a first electrode/a second magnetic layer/a nonmagnetic spacer layer/a first magnetic layer/a second electrode, stacked in this order. The first magnetic layer has variable magnetization direction. The second magnetic layer has fixed magnetization direction. A thickness of the first magnetic layer in a direction connecting the first and second electrodes is greater than 2 times a spin penetration depth of the first magnetic layer. The thickness of the first magnetic layer is less than a maximum width of the second electrode. The first magnetic layer has edge portion provided outside the first surface when viewed along the direction. A width of the edge portion in a direction perpendicular to a tangent of an edge of the second electrode is not less than an exchange length of the first magnetic layer.

9 Claims, 7 Drawing Sheets

(56) References Cited

U.S. PATENT DOCUMENTS

| | | | |
|---|---|---|---|
| 2006/0060901 A1* | 3/2006 | Nakamura et al. | 257/295 |
| 2007/0187785 A1* | 8/2007 | Hung et al. | 257/421 |
| 2008/0121945 A1* | 5/2008 | Saito | 257/252 |
| 2009/0273421 A1* | 11/2009 | Cros et al. | 335/302 |
| 2010/0084725 A1* | 4/2010 | Zhu et al. | 257/421 |
| 2010/0091556 A1* | 4/2010 | Inokuchi et al. | 365/158 |
| 2010/0109108 A1* | 5/2010 | Zheng et al. | 257/421 |

FOREIGN PATENT DOCUMENTS

| | | |
|---|---|---|
| JP | 2009-064487 | 3/2009 |
| JP | 2009-194070 | 8/2009 |
| JP | 2009-194906 | 8/2009 |
| WO | 2010/053187 | 5/2010 |

* cited by examiner

US 8,569,852 B2

MAGNETIC OSCILLATION ELEMENT AND SPIN WAVE DEVICE

CROSS-REFERENCE TO RELATED APPLICATIONS

This application is based upon and claims the benefit of priority from the prior Japanese Patent Application No. 2011-068859, filed on Mar. 25, 2011; the entire contents of which are incorporated herein by reference.

FIELD

Embodiments described herein relate generally to a magnetic oscillation element, and spin wave device.

BACKGROUND

Radio waves in the microwave band and the millimeter wave band are utilized in a wide range of fields such as wireless communication devices, automotive radar systems, etc. High-frequency oscillators using semiconductors have complex configurations. On the other hand, magnetic oscillation elements that use the spin-transfer phenomenon in magnetic stacked films having sizes not more than about 100 nanometers (nm) have simple element structures. It is desirable to obtain a high frequency in magnetic oscillation elements.

DETAILED DESCRIPTION

Figure 1A:
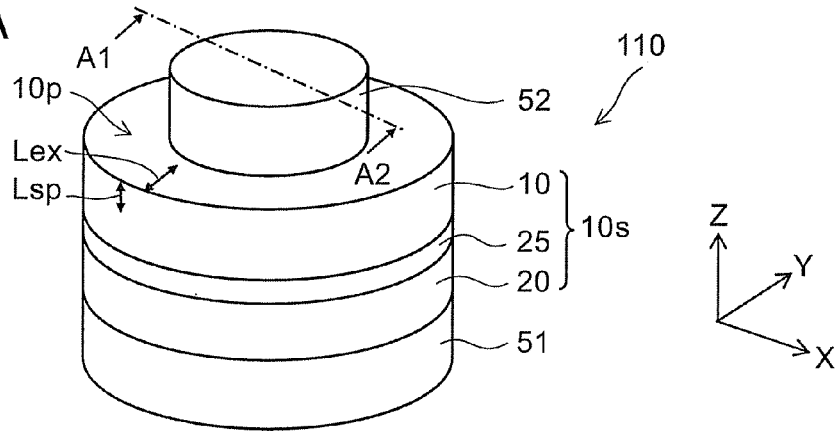
FIG. 1A to FIG. 1C are schematic views illustrating the configuration of a magnetic oscillation element according to the embodiment.

In general, according to one embodiment, a magnetic oscillation element includes a first electrode, a second electrode, a first magnetic layer, a second magnetic layer, a first spacer layer. The first magnetic layer is provided between the first electrode and the second electrode. The first magnetic layer has a variable magnetization direction. The second magnetic layer is provided between the first electrode and the first magnetic layer. The second magnetic layer has a fixed magnetization direction. The first spacer layer is nonmagnetic and provided between the first magnetic layer and the second magnetic layer. A thickness of the first magnetic layer in a first direction connecting the first electrode and the second electrode is greater than 2 times a spin penetration depth of the first magnetic layer. The thickness of the first magnetic layer is less than a maximum width of a first surface of the second electrode on the first magnetic layer side. The first magnetic layer has a first edge portion provided outside the first surface when viewed along the first direction. A width of the first edge portion in a direction perpendicular to a tangent of an edge of the first surface is not less than an exchange length of the first magnetic layer.

According to another embodiment, a magnetic oscillation element includes a first electrode, a second electrode, a first magnetic layer, a second magnetic layer, and a first spacer layer. The first magnetic layer is provided between the first electrode and the second electrode. The first magnetic layer has a variable magnetization direction. The second magnetic layer is provided between the second electrode and the first magnetic layer. The second magnetic layer has a fixed magnetization direction. The first spacer layer is nonmagnetic provided between the first magnetic layer and the second magnetic layer. The thickness of the first magnetic layer in a first direction connecting the first electrode and the second electrode is greater than 2 times a spin penetration depth of the first magnetic layer. The thickness of the first magnetic layer is less than a maximum width of a first surface of the second electrode on the second magnetic layer side. The first magnetic layer has a first edge portion provided outside the first surface when viewed along the first direction. A width of the first edge portion in a direction perpendicular to a tangent of an edge of the first surface is not less than an exchange length of the first magnetic layer.

According to another embodiment, a magnetic oscillation element includes a first electrode, a second electrode, a first magnetic layer, a second magnetic layer, a first spacer layer, and a cap layer. The first magnetic layer is provided between the first electrode and the second electrode. The first magnetic layer has a variable magnetization direction. The second magnetic layer is provided between the first electrode and the first magnetic layer. The second magnetic layer has a fixed magnetization direction. The first spacer layer is nonmagnetic and provided between the first magnetic layer and the second magnetic layer. The cap layer is nonmagnetic and provided between the first magnetic layer and the second electrode. The cap layer has a thickness of not more than 5 nanometers. A thickness of the first magnetic layer in a first direction connecting the first electrode and the second electrode is greater than 2 times a spin penetration depth of the first magnetic layer. The thickness of the first magnetic layer is less than a maximum width of a first surface of the second electrode on the first magnetic layer side. The first magnetic layer has a first edge portion provided outside the first surface when viewed along the first direction. A width of the first edge portion in a direction perpendicular to a tangent of an edge of the first surface is not less than an exchange length of the first magnetic layer.

According to another embodiment, a magnetic oscillation element includes a first electrode, a second electrode, a first magnetic layer, a second magnetic layer, and a first spacer layer. The first magnetic layer is provided between the first electrode and the second electrode. The first magnetic layer has a variable magnetization direction. The second magnetic layer is provided between the first electrode and the first magnetic layer.

The second magnetic layer has a fixed magnetization direction. The first spacer layer is nonmagnetic and provided between the first magnetic layer and the second magnetic layer. The first magnetic layer includes: a ferromagnetic fourth magnetic layer; and a ferromagnetic fifth magnetic layer contacting the first spacer layer between the fourth magnetic layer and the first spacer layer. A thickness of the first magnetic layer in a first direction connecting the first electrode and the second electrode is greater than 2 times a thickness of the fifth magnetic layer in the first direction. The thickness of the first magnetic layer is less than a maximum width of a first surface of the second electrode on the first magnetic layer side. The first magnetic layer has a first edge portion provided outside the first surface when viewed along the first direction. A width of the first edge portion in a direction perpendicular to a tangent of an edge of the first surface is not less than an exchange length of the fifth magnetic layer.

According to another embodiment, a magnetic oscillation element includes a first electrode, a second electrode, a first magnetic layer, a second magnetic layer, a first spacer layer, a cap layer. The first magnetic layer is provided between the first electrode and the second electrode. The first magnetic layer has a variable magnetization direction. The second magnetic layer is provided between the first electrode and the first magnetic layer. The second magnetic layer has a fixed magnetization direction. The first spacer layer is nonmagnetic and provided between the first magnetic layer and the second magnetic layer. The cap layer is nonmagnetic and provided between the first magnetic layer and the second electrode. The cap layer has a thickness of not more than 5 nanometers.

The first magnetic layer includes: a ferromagnetic fourth magnetic layer; and a ferromagnetic fifth magnetic layer contacting the first spacer layer between the fourth magnetic layer and the first spacer layer. A thickness of the first magnetic layer in a first direction connecting the first electrode and the second electrode is greater than 2 times a thickness of the fifth magnetic layer in the first direction. A thickness of the first magnetic layer is less than a maximum width of a first surface of the second electrode on the first magnetic layer side. The first magnetic layer has a first edge portion provided outside the first surface when viewed along the first direction.

A width of the first edge portion in a direction perpendicular to a tangent of an edge of the first surface is not less than an exchange length of the fifth magnetic layer.

According to another embodiment, a spin wave device includes a first electrode, a second electrode, a third electrode, a first magnetic layer, a second magnetic layer, a first spacer, a third magnetic layer, and a second spacer. The third electrode is juxtaposed with the second electrode in a direction intersecting a first direction connecting the first electrode and the second electrode. The first magnetic layer is provided between the first electrode and the second electrode and between the first electrode and the third electrode. The first magnetic layer has a variable magnetization direction. The second magnetic layer is provided between the first magnetic layer and the second electrode. The second magnetic layer has a fixed magnetization direction. The first spacer layer is nonmagnetic and provided between the first magnetic layer and the second magnetic layer. The third magnetic layer is provided between the first magnetic layer and the third electrode. The third magnetic layer has a fixed magnetization direction. The second spacer layer is nonmagnetic and provided between the first magnetic layer and the third magnetic layer. A thickness of the first magnetic layer in the first direction is greater than 2 times a spin penetration depth of the first magnetic layer. The thickness of the first magnetic layer is less than a maximum width of a first surface of the second electrode on the second magnetic layer side. The first magnetic layer has a first edge portion provided outside the first surface when viewed along the first direction. A width of the first edge portion in a direction perpendicular to a tangent of an edge of the first surface is not less than an exchange length of the first magnetic layer.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
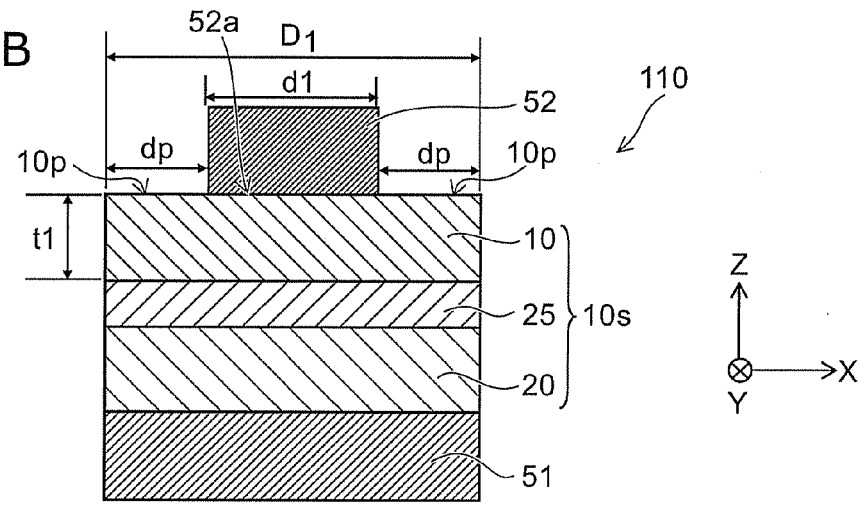
Figure 1C:
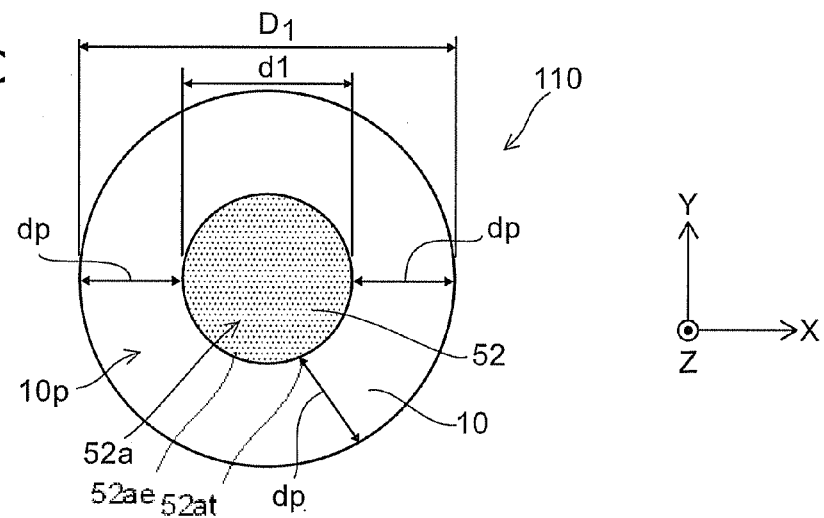

FIG. 1A to FIG. 1C are schematic views illustrating the configuration of a magnetic oscillation element according to the embodiment.

FIG. 1A is a perspective view. FIG. 1B is a cross-sectional view along line A1-A2 of FIG. 1A. FIG. 1C is a plan view including the interface between a first magnetic layer 10 and a second electrode 52.

As illustrated in FIG. 1A to FIG. 1C, the magnetic oscillation element 110 according to the embodiment includes a first electrode 51, the second electrode 52, and a stacked film 10s. The stacked film 10s is provided between the first electrode 51 and the second electrode 52.

An axis (a direction) connecting the first electrode 51 and the second electrode 52 is taken as a Z axis (a Z-axis direction, i.e., a first direction). For example, the direction from the first electrode 51 toward the second electrode 52 is the Z-axis direction. One direction perpendicular to the Z-axis direction is taken as an X-axis direction (a second direction). A direction perpendicular to the Z-axis direction and the X-axis direction is taken as a Y-axis direction (a third direction). A plane perpendicular to the Z-axis direction is taken as an X-Y plane.

The stacked film 10s includes the first magnetic layer 10, a second magnetic layer 20, and a first spacer layer 25. In the first magnetic layer 10, the magnetization direction (the magnetization direction of the first magnetic layer 10) is variable. The first magnetic layer 10 is, for example, a magnetization oscillation layer.

The second magnetic layer 20 is stacked with the first magnetic layer 10 along the Z-axis direction.

In the specification of the application, being stacked includes not only the state of being directly overlaid but also the state of being overlaid with another inserted component.

In the second magnetic layer 20, the magnetization direction (the magnetization direction of the second magnetic layer 20) is fixed.

The first spacer layer 25 is provided between the first magnetic layer 10 and the second magnetic layer 20. The first spacer layer 25 is nonmagnetic.

In the magnetic oscillation element 110, the first magnetic layer 10 is disposed between the second magnetic layer 20 and the second electrode 52. In other words, the second magnetic layer 20 is provided on the first electrode 51. The first spacer layer 25 is provided on the second magnetic layer 20. The first magnetic layer 10 is provided on the first spacer layer 25. The second electrode 52 is provided on the first magnetic layer 10. The second electrode 52 of the magnetic oscillation element 110 contacts the first magnetic layer 10.

The second electrode 52 has a first surface 52a that contacts the stacked film 10s (FIG. 1C). In this example, the second electrode 52 contacts the first magnetic layer 10; and the second electrode 52 contacts the first magnetic layer 10 at the first surface 52a.

The thickness of the first magnetic layer 10 along the Z-axis direction (a first thickness t1) is greater than 2 times a spin penetration depth Lsp of the first magnetic layer 10 (FIG. 1B and FIG. 1C). The spin penetration depth Lsp is described below.

The thickness of the first magnetic layer 10 (the first thickness t1) is less than the maximum width (a first surface width d1) of the first surface 52a of the second electrode 52.

The first surface width d1 passes through, for example, the centroid of the first surface 52a and is the distance connecting two points of the circumference of the first surface 52a. The first surface width d1 is the length of the first surface 52a in the X-Y plane. The first surface width d1 is, for example, the length of the first surface 52a along the X-axis direction. The first surface width d1 may be, for example, the length of the first surface 52a along the Y-axis direction.

The first magnetic layer 10 has a first edge portion 10p that protrudes outside the first surface 52a when viewed in plan. The first edge portion 10p is the portion of the first magnetic layer 10 provided outside the first surface 52a when viewed in plan. In other words, the first magnetic layer 10 has the first edge portion 10p provided outside the first surface 52a when viewed along the Z-axis direction. A width dp of the first edge portion 10p when viewed along the Z-axis direction is not less than an exchange length Lex of the first magnetic layer 10. The width dp of the first edge portion 10p is the length of the first edge portion 10p in the direction perpendicular to a tangent 52at of the edge 52ae of the first surface 52a. The exchange length Lex is described below. The first edge portion 10p is a portion of the first magnetic layer 10 and is a portion protruding outside the first surface 52a in the X-V plane.

In other words, the width of the first magnetic layer 10 (a first magnetic layer width $D_1$, i.e., a length in the X-Y plane) is wider than the first surface width d1 of the first surface 526 of the second electrode 52.

For example, the centroid of the first surface 52a of the second electrode 52 is disposed on the centroid of the configuration of the first magnetic layer 10 when viewed along the Z-axis direction. In such a case, $(D_1-d1)=2\cdot dp$. Because $dp>Lex$, it follows that $d1<(D_1-2\cdot Lex)$.

A high-frequency oscillation is obtained by the configuration recited above.

Although the configuration (the planar configuration) of the first magnetic layer 10 is substantially circular when viewed along the Z-axis direction in the example illustrated in FIG. 1A to FIG. 1C, the planar configuration of the first magnetic layer 10 is arbitrary. The first magnetic layer 10 may have any planar configuration such as a polygon or a flattened circle. Although the configuration (the planar configuration) of the second electrode 52 is substantially circular when viewed along the Z-axis direction, the planar configuration of the second electrode 52 is arbitrary.

For example, the first electrode 51 is provided on a not-illustrated substrate. A not-illustrated nonmagnetic foundation layer may be provided on the substrate; and the first electrode 51 may be provided on the foundation layer.

For example, as described below, a not-illustrated antiferromagnetic layer is provided between the first electrode 51 and the second magnetic layer 20. Thereby, the magnetization direction of the second magnetic layer 20 is fixed. Or, the magnetization direction of the second magnetic layer 20 may be fixed by making the thickness of the second magnetic layer 20 sufficiently thick. In such a case, the antiferromagnetic layer recited above may not be provided. The second magnetic layer 20 is, for example, a fixed magnetic layer.

On the other hand, such a fixation mechanism is not provided in the first magnetic layer 10. Thereby, the magnetization direction of the first magnetic layer 10 is variable.

It is possible to cause a current to flow between the first electrode 51 and the second electrode 52. Due to this current, both a torque to change the magnetization direction and a force to suppress the magnitization change that acts on the ferromagnetic body interior act on the magnetization inside the first magnetic layer 10. The torque to change the magnetization direction is, for example, spin-transfer torque. The force to suppress the magnitization change that acts on the ferromagnetic body interior is, for example, an exchange interaction. Thus, as a result of the coexisting competing effects, the magnetization of the first magnetic layer 10 performs a steady precession without relaxing to an equilibrium state while the current flows. The first magnetic layer 10 is, for example, a magnetization oscillation layer.

A spin-polarized electron current flows inside the magnetic oscillation element 110 when the current is caused to flow between the first electrode 51 and the second electrode 52. The spin polarization direction of the electron current aligns in a direction parallel to the magnetization direction of the magnetic body by the electron current passing through the magnetic body.

The electron current emitted from the magnetic body is spin-polarized in the magnetization direction of the magnetic body at the interface between the magnetic body and the nonmagnetic body. However, as the distance from the interface increases, the spin-polarized component of the electron current is lost at a constant relaxation length.

In the magnetic oscillation element 110, the flow of electrons which is spin-polarized in a direction parallel to the magnetization direction of the second magnetic layer 20 (the fixed magnetic layer) flows into the magnetization oscillation layer. A spin-transfer torque is applied to the magnetization of the first magnetic layer 10 (the magnetization oscillation layer).

The current density flowing through the first magnetic layer 10 is spatially nonuniform. Therefore, the effect of the spin-transfer torque is spatially nonuniform. Accordingly, a nonuniformity occurs also in the change of the magnetization direction.

Generally, a magnetic body has a property in which an exchange interaction acts between the magnetic moments to urge the magnetic moments to be in directions parallel to each other. Therefore, a force acts in a direction to suppress such a nonuniformity of the magnetization direction. In other words, the magnitization change occurring due to the spin transfer is suppressed by the exchange interaction becoming a restoring force.

In the magnetic oscillation element 110, the precession of the magnetization of the first magnetic layer 10 (the magnetization oscillation layer) is caused by a balance between the spin torque and the exchange interaction. Thus, a self-excited phenomenon is utilized. Therefore, it is unnecessary for the introduced current to be alternating current. In particular, it is notable when direct current or a pulse current having a sufficiently long duration is used. Thereby, a steady oscillation is obtained because the temporally-constant spin torque acts. In the case where a pulse current is used, the pulse width of the pulse current is not less than the reciprocal of the oscillation frequency.

In the magnetic oscillation element 110, the orientation of the current is arbitrary. In other words, the oscillation can be obtained using a current flowing from the first magnetic layer 10 toward the second magnetic layer 20 (an electron current flowing from the second magnetic layer 20 toward the first magnetic layer 10). In such a case, it is notable when the magnetization direction of the first magnetic layer 10 when current is not conducted is opposingly parallel to the magnetization direction of the second magnetic layer 20. Thereby, for example, a stable oscillation is obtained. Also, the oscillation can be obtained using a current flowing from the second magnetic layer 20 toward the first magnetic layer 10 (an electron current flowing from the first magnetic layer 10 toward the second magnetic layer 20). In such a case, it is notable when the magnetization direction of the first magnetic layer 10 when current is not conducted is parallel to the magnetization direction of the second magnetic layer 20. Thereby, for example, a stable oscillation is obtained.

It is more notable when the current flowing from the first magnetic layer 10 toward the second magnetic layer 20 (the electron current flowing from the second magnetic layer 20 toward the first magnetic layer 10) is used. According to this configuration, for example, the spin torque per current increases. Thereby, for example, it is possible to cause the oscillation using a current smaller than that of the case where the current flowing from the second magnetic layer 20 toward the first magnetic layer 10 is used.

In the embodiment, the voltage between these electrodes can be extracted as an output while causing the current (the constant current or the pulse current) to flow between the first electrode 51 and the second electrode 52.

A magnetoresistance effect occurs in the stacked film 10s that includes the first magnetic layer 10 (the magnetization oscillation layer), the spacer layer 25, and the second magnetic layer 20 (the fixed magnetic layer). In the magnetoresistance effect, the electrical resistance value changes according to the relative angle between the magnetization of the first magnetic layer 10 (the magnetization oscillation layer) and the magnetization of the second magnetic layer 20 (the fixed magnetic layer). This effect is utilized in the embodiment. In other words, the voltage is extracted while the current is caused to flow in the stacked film 10s to cause the magnetization of the first magnetic layer 10 (the magnetization oscillation layer) to oscillate. At this time, a resistance change occurs as the magnetization of the first magnetic layer 10 (the magnetization oscillation layer) oscillates. Then, an alternating current voltage having a frequency equal to the vibration frequency of the magnetization can be extracted.

Figure 2:
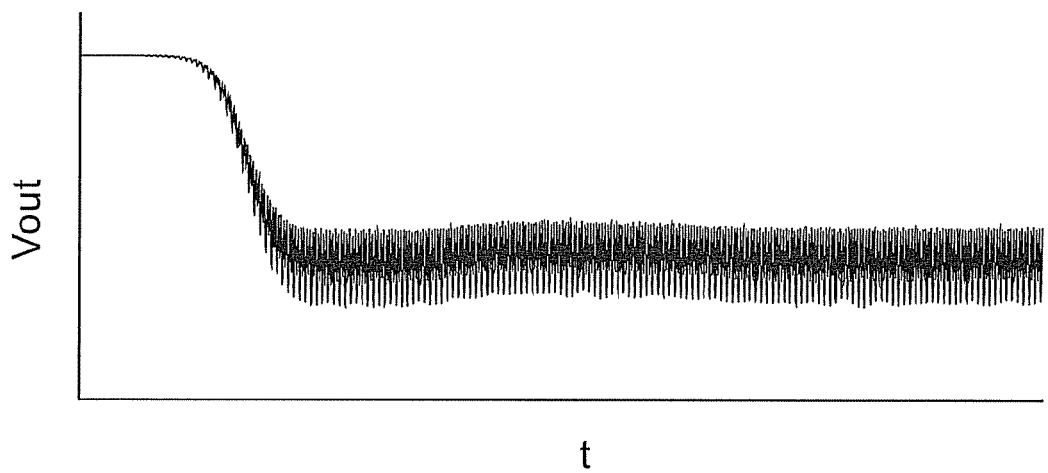
FIG. 2 is a graph illustrating an operation of the magnetic oscillation element according to the embodiment.

FIG. 2 is a graph illustrating an operation of the magnetic oscillation element according to the embodiment.

The horizontal axis of FIG. 2 is time t. The vertical axis is an output Vout of the element.

The output Vout oscillates as illustrated in FIG. 2. Such an oscillating output Vout can be utilized.

The inventor discovered that a unique oscillation characteristic is obtained when the configurations of the stacked film 10s, the electrodes (the first electrode 51 and the second electrode 52) are appropriately set. Results of a simulation of the oscillation characteristic of the element in which the configuration of the magnetic oscillation element is changed will now be described.

In this simulation, the Landau-Lifshitz-Gilbert equation, which is a model that describes the dynamics of the magnetization, is numerically solved. Thereby, the oscillation frequency of the magnetic oscillation element can be determined. In this simulation, the width of the second electrode 52 (the first surface width d1) was taken to be 40 nanometers (nm); and the spin penetration depth Lsp of the first magnetic layer 10 was taken to be 4 nm. The first magnetic layer 10 was taken to be an in-plane magnetic film having a saturation magnetization of 800 emu/cm$^3$, an anisotropic energy of 0 erg/cm$^3$, and an exchange stiffness of 1.4×10$^{-6}$ erg/cm. It was taken that an external magnetic field of 100 Oe was applied. The oscillation frequencies were calculated for first thicknesses t1 of the first magnetic layer 10 in a range of 4 nm to 24 nm.

Figure 3:
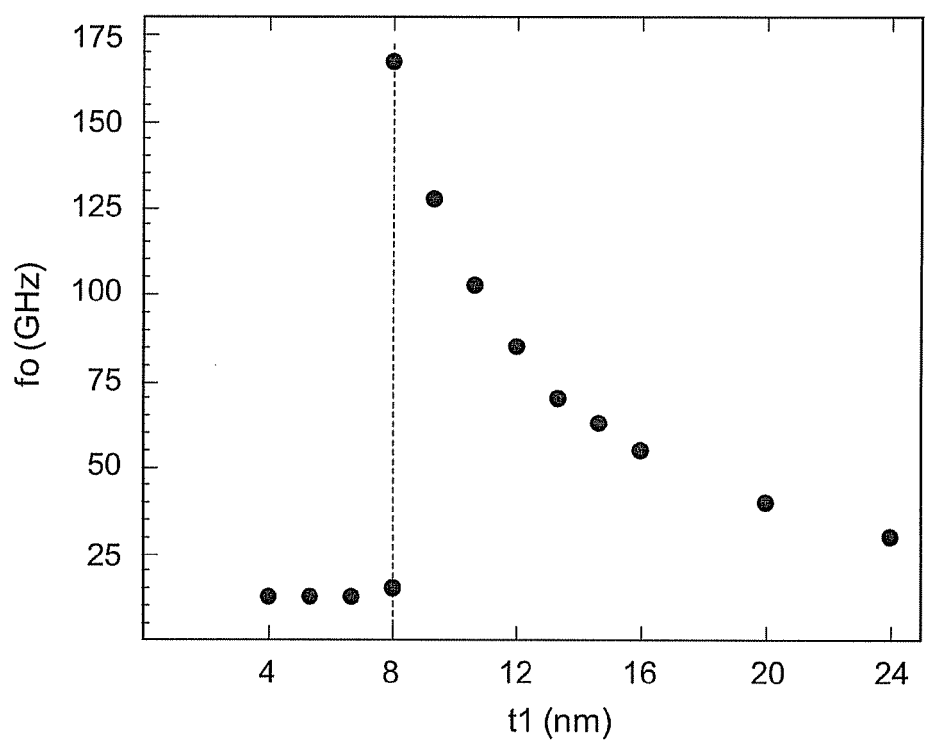
FIG. 3 is a graph illustrating the operations of the magnetic oscillation element.

FIG. 3 is a graph illustrating the operations of the magnetic oscillation element.

FIG. 3 illustrates the results of this simulation. The horizontal axis is the first thickness t1. The vertical axis is the oscillation frequency fo. The oscillation frequency fo is the peak value of the frequency of the occurring oscillation.

As illustrated in FIG. 3, the characteristic of the oscillation frequency fo changes greatly at the boundary where the first thickness t1 is 8 nm (2 times the spin penetration depth Lsp). In other words, the oscillation frequency fo is about 15 GHz when the first thickness t1 is thinner than 8 nm.

Conversely, the oscillation frequency fo becomes extremely high, i.e., about 50 GHz to 170 GHz, when the first thickness t1 is thicker than 8 nm. The oscillation frequency fo is particularly high when the first thickness t1 is more than 8 nm and not more than 16 nm. An even higher oscillation frequency fo is obtained when the first thickness t1 is more than 8 nm and not more than 12 nm (3 times the spin penetration depth Lsp).

Thus, it was discovered that the characteristic of the oscillation frequency fo changes greatly between the case where the first thickness t1 is less than 2 times the spin penetration depth Lsp and the case where the first thickness t1 is greater than 2 times the spin penetration depth Lsp.

Thus, it was not previously known that the characteristic of the oscillation frequency fo changes greatly at the boundary of the value of 2 times the spin penetration depth Lsp.

The configuration of the embodiment is constructed based on the phenomenon first discovered by this simulation. In other words, the first thickness t1 of the first magnetic layer 10 is set to be greater than 2 times the spin penetration depth Lsp. Thereby, a high-frequency oscillation is obtained.

Further, in this simulation, the Q factor of the oscillation (corresponding to fo/Δfo) was about 10$^2$ when the first thickness t1 was thinner than 8 nm. Conversely, the Q factor of the oscillation was not less than 10$^3$ when the first thickness t1 was thicker than 8 nm. Thus, when the first thickness t1 is thicker than 8 nm, the Q factor obtained is not less than 10 times the Q factor obtained when the first thickness t1 is thinner than 8 nm.

FIG. 4A to FIG. 4J are schematic views illustrating operations of the magnetic oscillation element.

These drawings illustrate results of a simulation of the behavior of the magnetization of the first magnetic layer 10. FIG. 4A to FIG. 4E illustrate the behavior of the magnetization when the first thickness t1 is thicker than 8 nm (2 times the spin penetration depth Lsp). States of the magnetization as time elapses are illustrated in order in FIG. 4A to FIG. 4E. FIG. 4F to FIG. 4J illustrate the behavior of the magnetization when the first thickness t1 is thinner than 8 nm (2 times the spin penetration depth Lsp). FIG. 4F to FIG. 4J illustrate states of the magnetization in order as time elapses. These drawings illustrate the magnetization of the thickness direction inside the first magnetic layer 10 (a magnetization 11 of different positions along the Z-axis direction).

As illustrated in FIG. 4F to FIG. 4J, a mode was observed in which the magnetization 11 oscillates simultaneously in the Z-axis direction (the thickness direction) when the first thickness t1 is less than 2 times the spin penetration depth Lsp.

On the other hand, as illustrated in FIG. 4A to FIG. 4E, the orientation of the magnetization 11 changes in the Z-axis direction when the first thickness t1 is greater than 2 times the spin penetration depth Lsp. For example, an out-of-phase oscillation mode was observed in which the phase of the portion of one thickness-direction end is the reverse of the phase of the portion of the other thickness-direction end. The wavelength of the oscillation mode of the magnetization direction is 2 times the thickness. It is conceivable that the occurrence of such an out-of-phase mode is the reason that a high frequency corresponding to the millimeter wave band is obtained.

Thus, in the embodiment, the magnetization 11 of the first magnetic layer 10 oscillates when a current is caused to flow between the first electrode 51 and the second electrode 52. The first magnetic layer 10 has a first portion 10p1 and a second portion 10p2. The second portion is juxtaposed with the first portion along the Z-axis direction. For example, the first portion is the portion of the first magnetic layer 10 on the first electrode 51 side; and the second portion is the portion of the first magnetic layer 10 on the second electrode 52 side. The first portion may be the portion on the second electrode 52 side; and the second portion may be the portion on the first electrode 51 side. The phase of the oscillation of the magnetization 11 of the first portion is different from the phase of the oscillation of the magnetization of the second portion. For example, the phase of the magnetization 11 of the first portion is opposite to the phase of the magnetization of the second portion.

Thus, it was discovered that an oscillation mode occurs in which the phase of the oscillation of the magnetization 11 changes along the thickness direction.

It is conceivable that the wavelength in the planar direction of the magnetization change is coupled to the frequency through the dispersion relation in the case where the first thickness t1 is thin (less than 2 times the spin penetration depth Lsp). Conversely, it is conceivable that the wavelength in the thickness direction of the magnetization change determines the frequency when the first thickness t1 is greater than 2 times the spin penetration depth Lsp.

The correspondence of the change of the oscillation mode with the large change of the oscillation frequency as the film thickness changes as described above also may be explained by the relationship (the dispersion relation) between the oscillation frequency f and the wave number k of the magnetization.

In the case where the first magnetic layer 10 is an in-plane magnetic film, the dispersion relation is represented by the first formula recited below.

[Formula 1]

$$f = \frac{\gamma}{2\pi}\sqrt{\left(4\pi M + H + \frac{2A}{M}k^2\right)\left(H + \frac{2A}{M}k^2\right)} \quad (1)$$

Here, γ is the gyromagnetic ratio, M is the saturation magnetization, H is the sum of the external magnetic field and the anisotropic magnetic field, and A is the exchange stiffness.

The wave number k is represented by the second formula recited below using a wavelength $\lambda_i$ of the planar direction and a wavelength $\lambda_z$ in the thickness direction of the magnitization change.

[Formula 2]

$$k = \sqrt{\left(\frac{2\pi}{\lambda_i}\right)^2 + \left(\frac{2\pi}{\lambda_z}\right)^2} \quad (2)$$

In the oscillation mode that is uniform in the thickness direction, the wavelength $\lambda_z$ in the thickness direction becomes infinite. Therefore, from the first formula, the oscillation frequency f does not depend on the thickness and is determined by the wavelength $\lambda_i$ of the planar direction.

Because the wavelength $\lambda_i$ of the planar direction is about 2 times the width d1 of the second electrode 52 (80 nm), the oscillation frequency determined by the first formula is 14.8 GHz. This value substantially matches the simulation results of the case where the first thickness t1 is thin (less than 2 times the spin penetration depth Lsp). In other words, this supports the occurrence of the oscillation mode that does not change in the thickness direction in the case where the first thickness t1 is thin (less than 2 times the spin penetration depth Lsp).

Conversely, it can be seen from the first formula that the frequency of the oscillation mode that changes in the thickness direction strongly depends on the wavelength $\lambda_z$ in the thickness direction. For example, the frequency is 86.5 GHz when the thickness is 12 nm; and the frequency is 56.5 GHz when the thickness is 16 nm. These values are determined by using about 2 times the width d1 of the second electrode 52 (80 nm) as the wavelength in the planar direction and by using 2 times the first thickness t1 (24 nm and 32 nm) as the wavelength $\lambda_z$ in the thickness direction. These values substantially match the simulation results illustrated in FIG. 3. In other words, this supports the occurrence of the oscillation mode that changes in the thickness direction when the first thickness t1 is greater than 2 times the spin penetration depth Lsp.

From the first formula, in the case where the first thickness t1 is greater than 2 times the spin penetration depth Lsp, the wavelength $\lambda_z$ in the thickness direction is set to be shorter than the wavelength $\lambda_i$ of the planar direction to obtain the condition in which the frequency is strongly related to the first thickness t1. In the magnetic oscillation element according to the embodiment, this condition is satisfied because the first thickness t1 is smaller than the width d1 of the second electrode 52.

It is conceivable that this phenomenon reflects the change of the magnetization along the thickness direction being dominated by the boundary conditions of the interface between the magnetic layer and the nonmagnetic layer and the frequency being determined by the wavelength being scattered. Conversely, it is conceivable that such a mechanism for determining the frequency does not exist in the case where the first thickness t1 is thin. It is conceivable that differences in such a mechanism may cause the differences in the characteristic of the oscillation frequency fo recited above to occur.

Figures 4A, 4B, 4C, 4D, 4E:
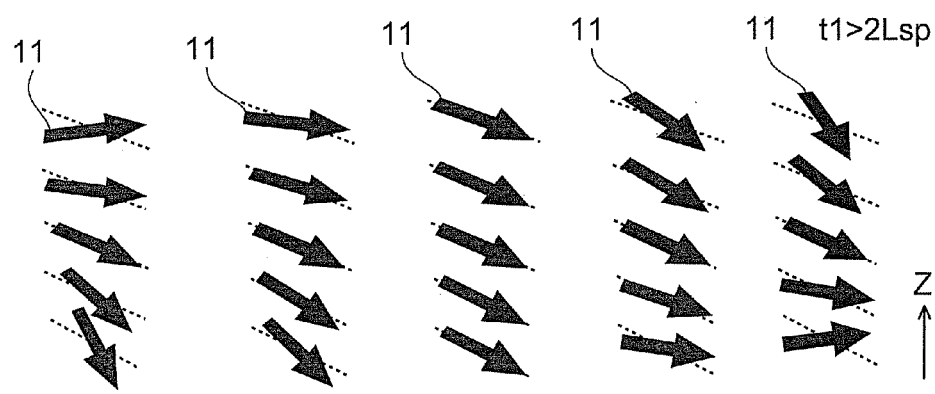
FIG. 4A to FIG. 4J are schematic views illustrating operations of the magnetic oscillation element.
Figures 4F, 4G, 4H, 4I, 4J:
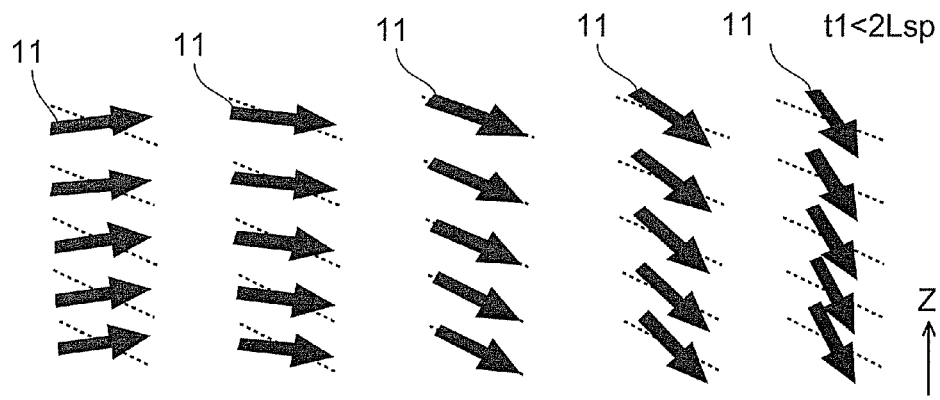

Although the mode was the out-of-phase mode illustrated in FIG. 4A and FIG. 4B at the initial stage of causing the current to flow in the stacked film 10s when the first thickness t1 was 8 nm (2 times the spin penetration depth Lsp), the mode changed to the in-phase mode illustrated in FIG. 4C and FIG. 4D partway through the precession.

Thus, the characteristic of the oscillation frequency fo changes greatly and the Q factor also changes greatly at the boundary of the value of 2 times the spin penetration depth Lsp. The behavior of the magnetization also changes greatly between the in-phase mode and the out-of-phase mode.

A high-frequency magnetization oscillation not affected by current-produced magnetic fields is stably obtained by the width d1 of the second electrode 52 being reduced to be within a range that satisfies the conditions recited above. The current-produced magnetic field occurring when a current having a current density 3 of $10^6$ A/cm$^2$ is caused to flow through the second electrode 52 has a maximum value at the boundary line of the first surface 52a. For example, when the first surface 52a has a circular configuration, the value of this current-produced magnetic field (Oe) is 0.03×J(A/cm$^2$)×d1 (nanometers). This is about the same for other configurations as well. Accordingly, if the width d1 of the second electrode 52 is not more than 100 nm, the maximum value of the current-produced magnetic field is not more than 300 Oe and the effect of the current-produced magnetic field can be kept small even in the case where, for example, a current having a current density of $10^8$ A/cm$^2$ is caused to flow. If the width d1 of the second electrode 52 is not more than 50 nm, the maximum value of the current-produced magnetic field is not more than 150 Oe; and the magnitude of the current-produced magnetic field can be kept to not more than about the same as that of an anisotropic magnetic field. Accordingly, in such a case, it is notable that, for example, closure domains of the magnetization state inside the first magnetic layer 10 due to effects of the current-produced magnetic field can be suppressed and a magnetization oscillation having a high oscillation frequency can be stably obtained.

There exist point-contact configurations in which the width of the second electrode 52 (the first surface width d1) is smaller than the width of the first magnetic layer 10 (the first magnetic layer width $D_1$). However, the unique phenomenon in which the oscillation characteristic alters at the boundary of the value of 2 times the spin penetration depth Lsp has not been known.

In other words, the setting of the first thickness t1 of the first magnetic layer 10 to be greater than 2 times the spin penetration depth Lsp is not simply a selection of design conditions extending from conventional concepts. By setting the first thickness t1 of the first magnetic layer 10 to be greater than 2 times the spin penetration depth Lsp, the critical characteristic occurring as described in regard to FIG. 3 and FIGS. 4A to 4J is obtained.

Thus, in the embodiment, it is possible to excite a mode having a magnetization motion state qualitatively different from that of a conventional magnetic oscillation element by using the spin-transfer phenomenon. Thereby, the oscillation frequency can be markedly higher than that of conventional elements.

The oscillation mode of the conventional magnetic oscillation element is a spatially uniform magnetization oscillation or an oscillation mode in which the spatial change of the magnetization is permitted only in the planar direction.

Conversely, in the embodiment, the oscillation mode that spatially changes in the thickness direction is excited. Thereby, the oscillation frequency is caused to increase markedly.

In the embodiment as recited above, the first thickness t1 is set to be greater than 2 times the spin penetration depth Lsp. The spin torque acts on the magnetization 11 of the first magnetic layer 10 when the current is caused to flow in the magnetic element. This phenomenon, when interpreted microscopically, occurs due to the result of the exchange interaction between the spin-polarized conduction electrons and the localized electrons of the magnetization 11 of the first magnetic layer 10.

Focusing now on the spin polarization of the current, the component (the lateral component) of the spin polarization direction of the electron current perpendicular to the magnetization direction of the first magnetic layer 10 is lost at an attenuation length $\lambda_J$ by the electron current passing through the first magnetic layer 10.

The attenuation length $\lambda_J$ is called the spin penetration depth Lsp. The spin penetration depth Lsp is represented by, for example, the third formula recited below.

$$\lambda_J = (2hD_0/\pi J)^{1/2} \quad (3)$$

Here, h (eV·second, eV·s) is Planck's constant. $D_0$ (square meter/second, m$^2$/s) is the diffusion coefficient of the electron. J (electron volt, eV) is the coefficient of the s-d interaction; and r is the circular constant.

$D_0$ is, for example, $10^{-3}$ m$^2$/s. J is, for example, 0.1 eV to 0.4 eV. By using these values, $\lambda_J$ is 1.8 nm to 3.6 nm.

On the other hand, there is a method for estimating the spin penetration depth from the line width of the frequency peak of ferromagnetic resonance (FMR). By this method, estimates of the spin penetration depth of the material that can be used as the first magnetic layer 10 are, for example, as follows. The spin penetration depths of permalloy (Py), ferrocobalt (CoFe), and CoFeB are 3.7 nm, 2.5 nm, and 12.0 nm, respectively. Accordingly, the first thickness t1 is set to a value thicker than 7.4 nm, 5.0 nm, and 24.0 nm when permalloy, ferrocobalt, and CoFeB, respectively, are used as the first magnetic layer 10.

The spin penetration depth Lsp is different from a so-called spin diffusion length. A spin diffusion length $\lambda_{sdl}$ means the characteristic length at which the component (the longitudinal component) parallel to the magnetization direction of the spin polarization of the conduction electrons attenuates. Generally, the spin penetration depth Lsp that represents the attenuation distance of the component (the transverse component) perpendicular to the magnetization direction is shorter than the spin diffusion length.

In the embodiment, the first thickness t1 is set to be shorter than the width of the first surface 52a (the first surface width d1) of the second electrode 52 that contacts the stacked film 10s. Thereby, in the case where a mode including both the spatial change of the thickness direction of the magnetization and the spatial change of the planar direction of the magnetization is realized, the spatial change of the thickness direction is smaller than the spatial change of the planar direction. This is a state in which the oscillation frequency fo strongly depends on the spatial change of the thickness direction, i.e., the wavelength in the thickness direction.

In the embodiment, the first magnetic layer 10 has the first edge portion 10p provided outside the first surface 52a when viewed along the Z-axis direction. The width dp of the first edge portion 10p in the direction perpendicular to the tangent of the edge of the first surface 52a when viewed along the Z-axis direction is set to be not less than the exchange length Lex of the first magnetic layer 10. For example, in the case where the centroid of the first surface 52a of the second electrode 52 is disposed on the centroid of the configuration of the first magnetic layer 10 when viewed along the Z-axis direction, d1<($D_1$−2·Lex). In other words, the first surface width d1 of the first surface 52a is set to be smaller than the width of the first magnetic layer 10 (the first magnetic layer width $D_1$); and the absolute value of the difference between the first surface width d1 of the first surface 52a and the first magnetic layer width $D_1$ is set to be greater than 2 times the exchange length Lex.

This creates a state in which the magnitization angle change due to the spin torque coexists with the restoring force due to the exchange interaction. Accordingly, a high-frequency oscillation is stably obtained by the width of the first edge portion being not less than the exchange length of the first magnetic layer 10.

The exchange length Lex is represented by the fourth formula recited below.

$$Lex=(2A_0/HM)^{1/2} \qquad (4)$$

Here, $A_0$ (erg/centimeter, erg/cm) is the exchange stiffness. M (emu/cubic centimeter, emu/cm$^3$, erg/cc) is the saturation magnetization. H (oersted, Oe) is the sum of the external magnetic field and the anisotropic magnetic field. $A_o$ is, for example, $1.0 \times 10^{-6}$ erg/cm to $1.5 \times 10^{-6}$ erg/cm. The saturation magnetization M is, for example, 300 emu/cm$^3$ to 1500 emu/cm$^3$.

For example, in the case of an exchange stiffness of $1.4 \times 10^{-6}$ erg/cm$^3$ and a saturation magnetization of 1400 Oe for a material having an anisotropic magnetic field of 150 Oe, the exchange length Lex when the external magnetic field is not applied is 37 nm.

In the case where a material having a small anisotropic energy such as permalloy is used as the first magnetic layer 10 (the magnetization oscillation layer), the magnetization direction when current is not conducted is specified by providing an external magnetic field not less than about 100 Oe. The exchange length Lex of the permalloy is, for example, 50 nm and 16 nm when the external magnetic field is 100 Oe and 1 kOe, respectively.

In the case where the sum of the external magnetic field and the anisotropic magnetic field is not less than 100 Oe and not more than 1 kOe for a magnetic material having a saturation magnetization of about 800 Oe to 1400 Oe and an exchange stiffness of about $1 \times 10^{-6}$ erg/cm, the exchange length Lex is in the range of not less than 10 nm and not more than 50 nm.

For example, the first surface width d1 of the first surface 52a is set to be smaller than the width of the first magnetic layer 10 (the first magnetic layer width $D_1$); and the absolute value of the difference between the first surface width d1 of the first surface 52a and the first magnetic layer width $D_1$ is set to be greater than 10 nm. Thereby, the restoring force due to the exchange interaction is obtained.

Thereby, a high-frequency oscillation is stably obtained.

Generally, when attempting to obtain a high frequency corresponding to the millimeter wave band in a conventional magnetic oscillation element using the spin-transfer phenomenon, it is necessary to apply a strong magnetic field that exceeds, for example, 10 kOe. Conversely, in the embodiment, such a high-frequency oscillation can be obtained using a weak magnetic field of not more than, for example, 100 Oe or without using an external magnetic field.

As illustrated in FIG. 1A to FIG. 1C, it is notable when there is a certain width from the circumferential edge of the first surface 52a to the circumferential edge of the first magnetic layer 10. Thereby, a sufficient restoring force due to the exchange interaction is obtained effectively in a region along the circumferential edge of the first magnetic layer 10. However, the embodiment is not limited thereto. For example, a portion of the circumferential edge of the first magnetic layer 10 for which the width dp of the first edge portion 10p is less than the exchange length Lex may exist. For example, in the case where the length along the circumferential edge of the region for which the width dp of the first edge portion 10p is less than the exchange length Lex is sufficiently short, the restoring force due to the exchange interaction acts and the oscillation is sustainably obtained.

In the embodiment, the second magnetic layer 20 may have a perpendicular magnetic anisotropy; or the second magnetic layer 20 may have an in-plane magnetic anisotropy.

In the specification of the application, the perpendicular magnetic anisotropy refers to the perpendicular component of the magnetization (the component of the magnetization in the direction parallel to the thickness direction) being larger than the in-plane component of the magnetization (the component of the magnetization in the direction perpendicular to the thickness direction). In other words, in the second magnetic layer 20 having the perpendicular magnetic anisotropy, the magnetization along the Z axis is larger than the magnetization along the X axis and is larger than the magnetization along the Y axis.

In the specification of the application, in-plane magnetic anisotropy refers to the perpendicular component of the magnetization being smaller than the in-plane component of the magnetization. In other words, in the second magnetic layer 20 having in-plane magnetic anisotropy, the magnetization along the Z axis is smaller than at least one selected from the magnetization along the X axis and the magnetization along the Y axis.

Figure 5A:
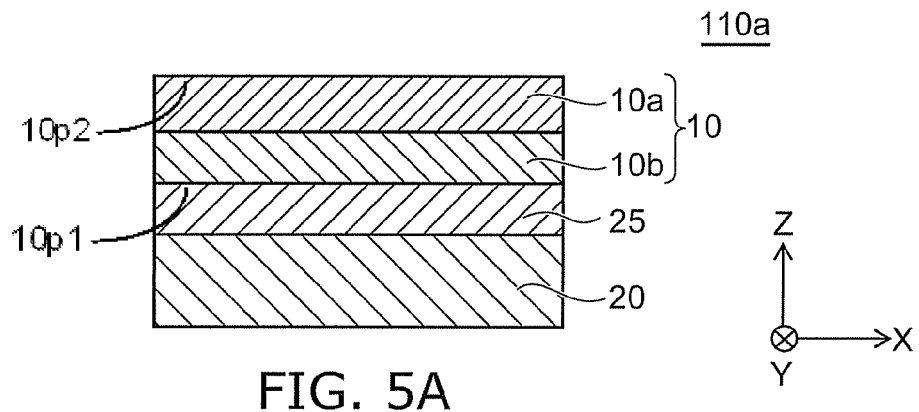
FIG. 5A and FIG. 5B are schematic cross-sectional views illustrating the configurations of portions of magnetic oscillation elements according to the embodiment.
Figure 5B:
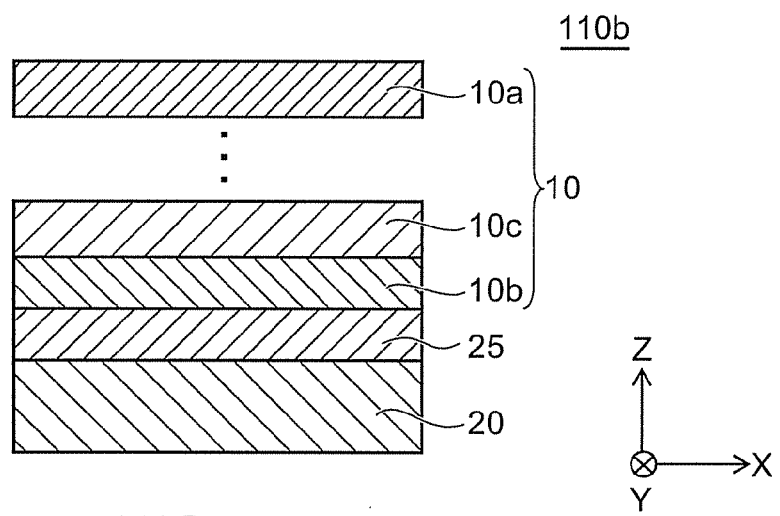

FIG. 5A and FIG. 5B are schematic cross-sectional views illustrating the configurations of portions of magnetic oscillation elements according to the embodiment.

In the magnetic oscillation element 110a of an example according to the embodiment as illustrated in FIG. 5A, the first magnetic layer 10 has a stacked structure of multiple layers. In this example, the first magnetic layer 10 includes a fourth magnetic layer 10a and a fifth magnetic layer 10b. The fifth magnetic layer 10b is provided between the fourth magnetic layer 10a and the first spacer layer 25. Specifically, the fifth magnetic layer 10b contacts the first spacer layer 25 between the fourth magnetic layer 10a and the first spacer layer 25. The fourth magnetic layer 10a and the fifth magnetic layer 10b are ferromagnetic.

In the case where the first magnetic layer 10 has such a stacked structure, because the spin-polarized component of the electron current is lost at the interface between the adjacent magnetic layers, the substantial spin penetration depth of the first magnetic layer 10 is equal to the film thickness of the magnetic layer (the fifth magnetic layer 10b) of the magnetic layers recited above (the fourth magnetic layer 10a and the fifth magnetic layer 10b) that is most proximal to the spacer layer. Accordingly, in this case, a high oscillation frequency is obtained by the thickness of the entire first magnetic layer 10 being not less than 2 times the thickness of the magnetic layer (the fifth magnetic layer 10b) of the magnetic layers included in the first magnetic layer 10 that is most proximal to the first spacer layer 25. In the case where the first magnetic layer 10 has such a stacked structure, it is notable when the thickness of the magnetic layer (the fifth magnetic layer 10b) recited above is set to be not more than ½ of the thickness of the first magnetic layer 10. Thereby, the mode having different phases of the magnetization 11 along the thickness direction (e.g., the out-of-phase mode described in regard to FIG. 4A and FIG. 4B) occurs even in the case where, for example, the thickness of the first magnetic layer 10 is thin.

As an example, in the case where the first magnetic layer 10 has a stacked structure including a 2 nm fifth magnetic layer 10b of FeCo and a 2.5 nm fourth magnetic layer 10a of FeCoB, a high-frequency magnetization oscillation is obtained for the first magnetic layer 10 which has a thickness of 4.5 nm as an entirety. In other words, in this configuration, a magnetization oscillation having a frequency higher than that of the case where the first magnetic layer 10 is a single layer of FeCo is obtained even in the case where the thickness of the first magnetic layer 10 is thin.

It is notable when the thickness of the first magnetic layer 10 is thinner because, for example, the current value necessary for the oscillation decreases. In this configuration as well, the conditions regarding the width of the second electrode 52, etc., are similar to those of the embodiment recited above. In other words, the width of the first surface 52a of the second electrode 52 is greater than the thickness of the first magnetic layer 10. The width of the first edge portion 10p of the first magnetic layer 10 in the direction perpendicular to the tangent of the edge of the first surface 52a is not less than the exchange length of the first magnetic layer 10. Herein, the exchange length of the first magnetic layer 10 means the exchange length of the magnetic layer (the fifth magnetic layer 10b) of the magnetic layers included in the first magnetic layer 10 that is most proximal to the spacer layer. In this example as well, it is notable when the width of the second electrode 52 is not more than 100 nm and more notable when not more than nm. Thereby, the closure domains due to the current-produced magnetic field can be suppressed; and a high-frequency magnetization oscillation is stably obtained.

In a magnetic oscillation element 110b of another example according to the embodiment as illustrated in FIG. 5B, the first magnetic layer 10 further includes a sixth magnetic layer 10c in addition to the fourth magnetic layer 10a and the fifth magnetic layer 10b. The sixth magnetic layer 10c is provided between the fourth magnetic layer 10a and the fifth magnetic layer 10b. The sixth magnetic layer 10c is ferromagnetic. In such a case as well, a high-frequency magnetization oscillation is obtained even in the case where the thickness of the first magnetic layer 10 is thin. The number of magnetic layers included in the first magnetic layer 10 is arbitrary.

Figure 6:
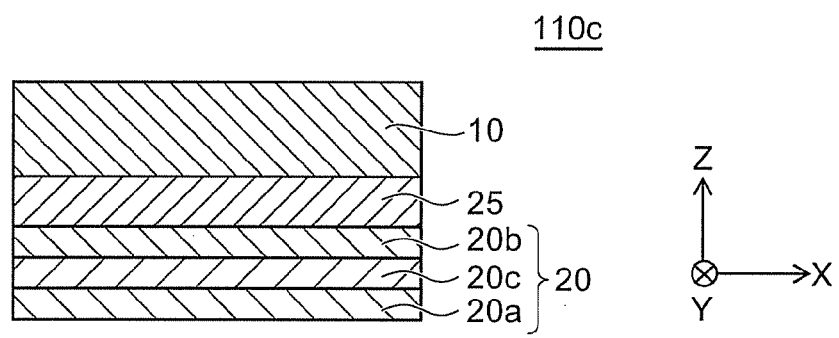
FIG. 6 is a schematic cross-sectional view illustrating the configuration of a portion of another magnetic oscillation element according to the embodiment.

FIG. 6 is a schematic cross-sectional view illustrating the configuration of a portion of another magnetic oscillation element according to the embodiment.

In the magnetic oscillation element 110c of this example according to the embodiment as illustrated in FIG. 6, the second magnetic layer 20 has a stacked structure of multiple layers.

In this example, the second magnetic layer 20 includes a seventh magnetic layer 20a, an eighth magnetic layer 20b, and a nonmagnetic layer 20c. The eighth magnetic layer 20b is provided between the seventh magnetic layer 20a and the first spacer layer 25. The nonmagnetic layer 20c is provided between the seventh magnetic layer 20a and the eighth magnetic layer 20b. The seventh magnetic layer 20a and the eighth magnetic layer 20b are ferromagnetic layers.

Thus, the second magnetic layer 20 may include multiple ferromagnetic layers and a nonmagnetic layer provided between the multiple ferromagnetic layers.

In this example, the number of the nonmagnetic layers is arbitrary. In other words, the second magnetic layer 20 may include multiple ferromagnetic layers alternately stacked with multiple nonmagnetic layers.

The coercive force of the ferromagnetic layers included in the second magnetic layer 20 (e.g., the seventh magnetic layer 20a, the eighth magnetic layer 20b, etc.) is larger than the coercive force of the first magnetic layer 10.

For example, in the case where the first magnetic layer 10 has a stacked structure of multiple layers and the second magnetic layer 20 has a stacked structure of multiple layers, the coercive force of the ferromagnetic layers included in the second magnetic layer 20 (e.g., the seventh magnetic layer 20a, the eighth magnetic layer 20b, etc.) is larger than the coercive force of the magnetic layers included in the first magnetic layer 10 (e.g., the fourth magnetic layer 10a, the fifth magnetic layer 10b, the sixth magnetic layer 10c, etc.).

The first magnetic layer 10 and the second magnetic layer 20 may include various magnetic materials. The material of the first magnetic layer 10 may be different from the material of the second magnetic layer 20.

At least one selected from the first magnetic layer 10 and the second magnetic layer 20 may include, for example, a magnetic alloy including at least one element selected from the group consisting of iron (Fe), cobalt (Co), nickel (Ni), manganese (Mn), and chrome (Cr).

At least one selected from the first magnetic layer 10 and the second magnetic layer 20 may include, for example, permalloy (FeNi alloy), CoFe alloy, etc.

The first magnetic layer 10 and the second magnetic layer 20 may include, for example, a magnetic material having perpendicular magnetic anisotropy and a large uniaxial anisotropy constant Ku.

For a material having a large uniaxial anisotropy constant Ku, the anisotropic magnetic field defined by Hk=2 Ku/M is large. Accordingly, the exchange length Lex is short. Therefore, the difference between the magnetic layer width and the electrode width can be reduced. Examples of such a material include alloys formed of a combination of at least one element selected from the group consisting of Fe, Co, Ni, Mn, and Cr and at least one element selected from the group consisting of Pt, Pd, Ir, Ru, and Rh.

The value of the uniaxial anisotropy constant can be adjusted also by the composition of the magnetic material used as the magnetic layer, the crystalline order due to heat treatment, etc.

At least one selected from the first magnetic layer 10 and the second magnetic layer 20 may include, for example, a magnetic material having perpendicular magnetic anisotropy and having a hcp crystal structure (a hexagonal close-packed structure). Such a magnetic material may include, for example, a metal having a main component of Co. At least one selected from the first magnetic layer 10 and the second magnetic layer 20 may include a metal having a structure other than the hcp structure.

At least one selected from the first magnetic layer 10 and the second magnetic layer 20 may include, for example, an alloy of a rare-earth element and an iron group transition element that has perpendicular magnetic anisotropy. The first magnetic layer 10 and the second magnetic layer 20 may include, for example, at least one selected from GdFe, GdCo, GdFeCo, TbFe, TbCo, TbFeCo, GdTbFe, GdTbCo, DyFe, DyCo, DyFeCo, etc.

In the configuration in which the second magnetic layer includes the multiple ferromagnetic layers and the nonmagnetic layer provided between the multiple ferromagnetic layers, the multiple ferromagnetic layers (e.g., the seventh magnetic layer 20a, the eighth magnetic layer 20b, etc.) may include, for example, at least one selected from Co, CoCr, and CoFe. The nonmagnetic layer 20c may include Pt or Pd.

For example, the first magnetic layer 10 may have a configuration in which a magnetic layer of Co is repeatedly stacked alternately with a nonmagnetic layer of Pt. The number of repetitions may be, for example, 3 to 6.

In the case where at least one selected from the first magnetic layer 10 and the second magnetic layer 20 has a stacked structure, the magnetic layers contacting the first spacer layer 25 (e.g., the fifth magnetic layer 10b, the eighth magnetic layer 20b, etc.) may include an alloy including at least one selected from the group consisting of Fe, Co, and Ni or at least one selected from the group consisting of Fe, Co, Ni, Mn, and Cr. Such alloys include, for example, soft magnetic materials such as CoNbZr, FeTaC, CoTaZr, FeAlSi, FeB, CoFeB, etc.

In the case where at least one selected from the first magnetic layer 10 and the second magnetic layer 20 has a stacked structure, the efficiency of the magnetization oscillation due to the spin transfer is increased by using a material having a high degree of spin polarization in the magnetic layers contacting the first spacer layer 25 (e.g., the fifth magnetic layer 10b, the eighth magnetic layer 20b, etc.). Thereby, the current threshold necessary for the magnetization oscillation decreases. Further, the reading is easier because the magnetoresistance ratio increases.

In the case where at least one selected from the first magnetic layer 10 and the second magnetic layer 20 has a stacked structure, it is notable when a material having a high degree of spin polarization called a half-metal is used in the magnetic layers contacting the first spacer layer 25 (e.g., the fifth magnetic layer 10b, the eighth magnetic layer 20b, etc.). Examples of half-metals include Heusler alloys, rutile-type oxides, spinel-type oxides, perovskite-type oxides, double perovskite-type oxides, sphalerite-type chromium compounds, sphalerite-type manganese compounds, pyrite-type manganese compounds, sendust alloys, and magnetic semiconductors. Specific examples of half-metals include, for example, $Co_2MnSi$, $CrO_2$, $Fe_3O_4$, $La_{1-x}Sr_xMnO_3$, etc.

The magnetic body of at least one selected from the first magnetic layer 10 and the second magnetic layer 20 may include at least one nonmagnetic element selected from Ag, Cu, Au, Al, Mg, Si, Bi, Ta, B, C, O, N, Pd, Pt, Zr, Ir, W, Mo, Nb, and H. Thereby, the magnetic characteristics can be adjusted. Various properties such as the crystallinity, the mechanical properties, the chemical properties, etc., can be adjusted.

In the case where the second magnetic layer 20 has a multilayered structure, the nonmagnetic layer 20c included in the multilayered structure may include at least one selected from the group consisting of Cu, Au, Ag, Ru, Jr, and Os or an alloy including two or more selected from the group.

It is notable when the antiferromagnetic layer used to fix the magnetization of the second magnetic layer 20 includes Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, magnetic semiconductors, etc.

The first spacer layer 25 may include a nonmagnetic metal thin film or an insulative thin film. The nonmagnetic metal may include at least one selected from the group consisting of Au, Cu, Cr, Zn, Ga, Nb, Mo, Ru, Pd, Ag, Hf, Ta, W, Pt, and Bi or an alloy including at least one selected from the group.

The thickness of the first spacer layer 25 is set to be sufficiently smaller than the spin diffusion length of the first spacer layer 25 to sufficiently reduce the magneto-static coupling between the first magnetic layer 10 and the second magnetic layer 20. It is notable when the thickness of the first spacer layer 25 is, for example, not less than 0.2 nm and not more than 20 nm.

The first spacer layer 25 may include an insulating material; and the first spacer layer 25 may function as a tunneling barrier layer. Thereby, the magnetoresistance effects can be increased.

In such a case, the first spacer layer 25 may include, for example, $Al_2O_3$, $SiO_2$, MgO, AlN, $Bi_2O_3$, $MgF_2$, $CaF_2$, $SrTiO_3$, $AlLaO_3$, Al—N—O, Si—N—O, a nonmagnetic semiconductor, etc. The nonmagnetic semiconductor may include, for example, at least one selected from the group consisting of ZnO, InMn, GaN, GaAs, $TiO_2$, Zn, and Te, at least one selected from the group doped with a transition metal, etc. These compounds may not have stoichiometrically completely precise compositions. These compounds may have an excess amount, an insufficient amount, or a lack of oxygen, nitrogen, fluorine, etc.

In the case where the first spacer layer 25 includes an insulating material, it is notable when the thickness of the first spacer layer 25 is, for example, not less than 0.2 nm and not more than 5 nm. Thereby, the function as a tunneling barrier layer is obtained effectively.

In the case where the first spacer layer 25 is insulative, pinholes may exist in the interior of the first spacer layer 25. In such a case, the pinholes are filled with the material of at least one selected from the first magnetic layer 10 and the second magnetic layer 20.

A BMR (ballistic magnetoresistance) effect occurs due to a so-called magnetic point contact in which the first magnetic layer 10 and the second magnetic layer 20 are connected to each other via the pinholes. Thereby, an exceedingly large magnetoresistance effect is obtained. As a result, the amplitude of the output voltage increases.

It is notable when the opening diameter of the pinhole is not more than about 20 nm. The pinhole may have various configurations such as circular conic configurations, circular columnar configurations, spherical configurations, pyramid configurations, polygonal columnar configurations, etc. The number of the pinholes may be singular or plural.

Figure 7A:
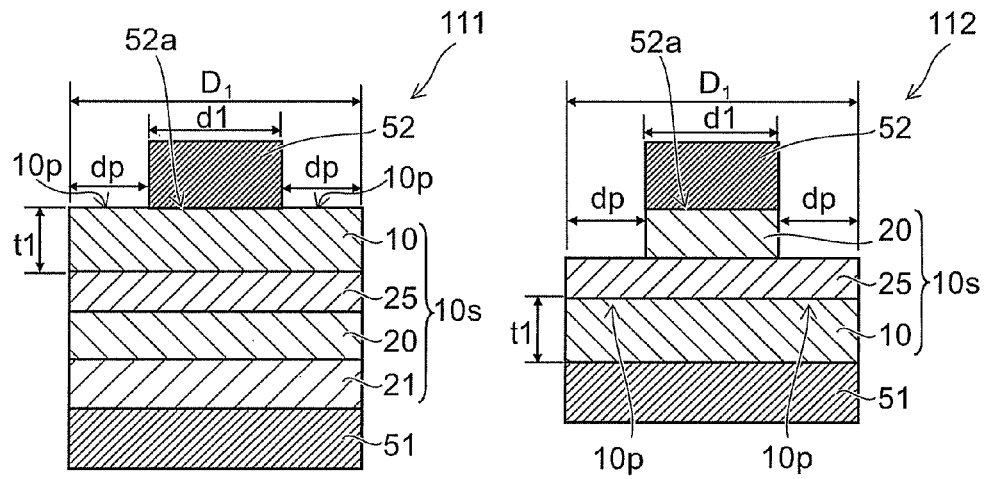
FIG. 7A to FIG. 7D are schematic cross-sectional views illustrating the configurations of other magnetic oscillation elements according to the embodiment.
Figure 7B:
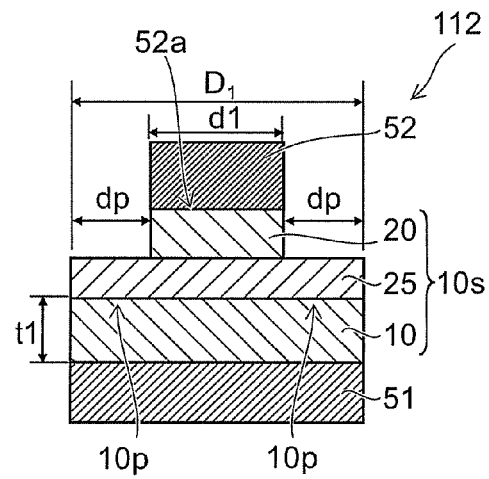
Figure 7C:
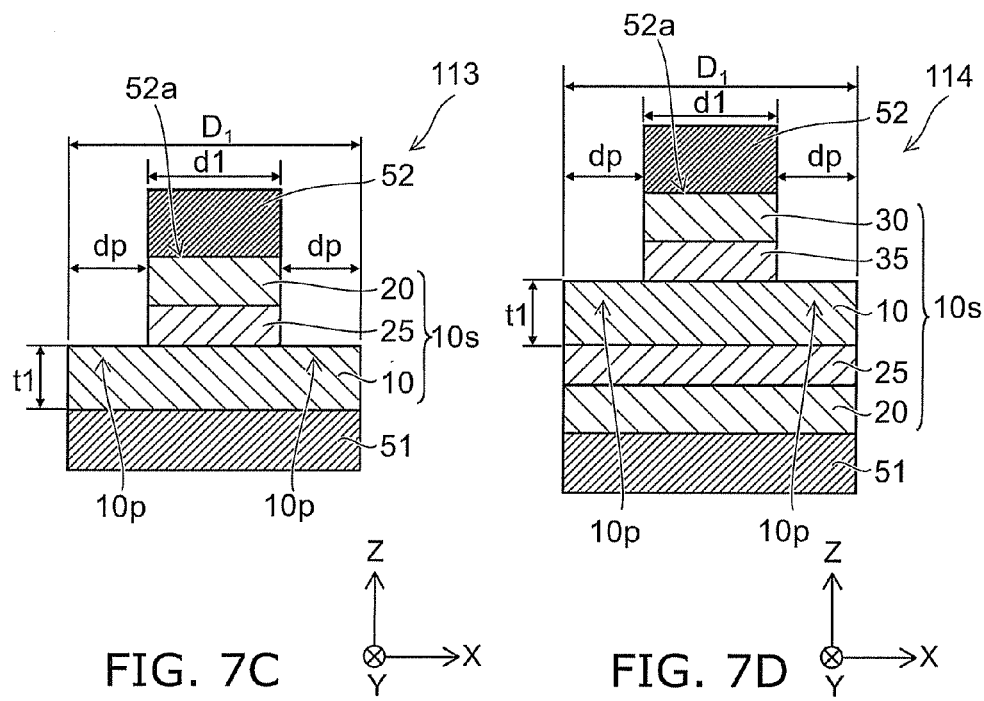
Figure 7D:
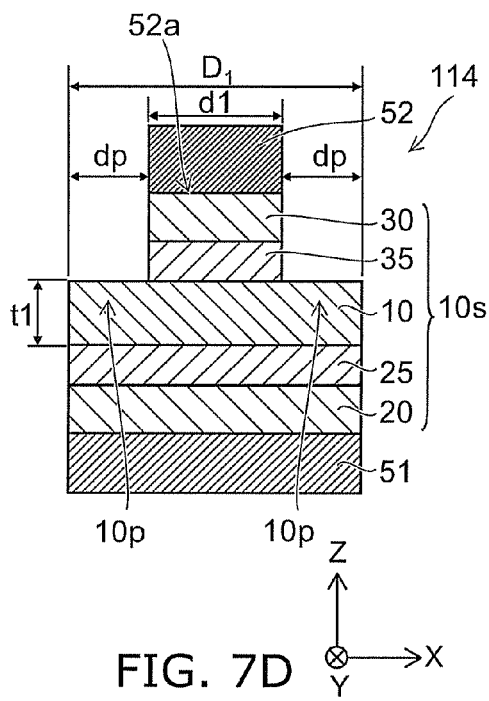
Figure 8A:
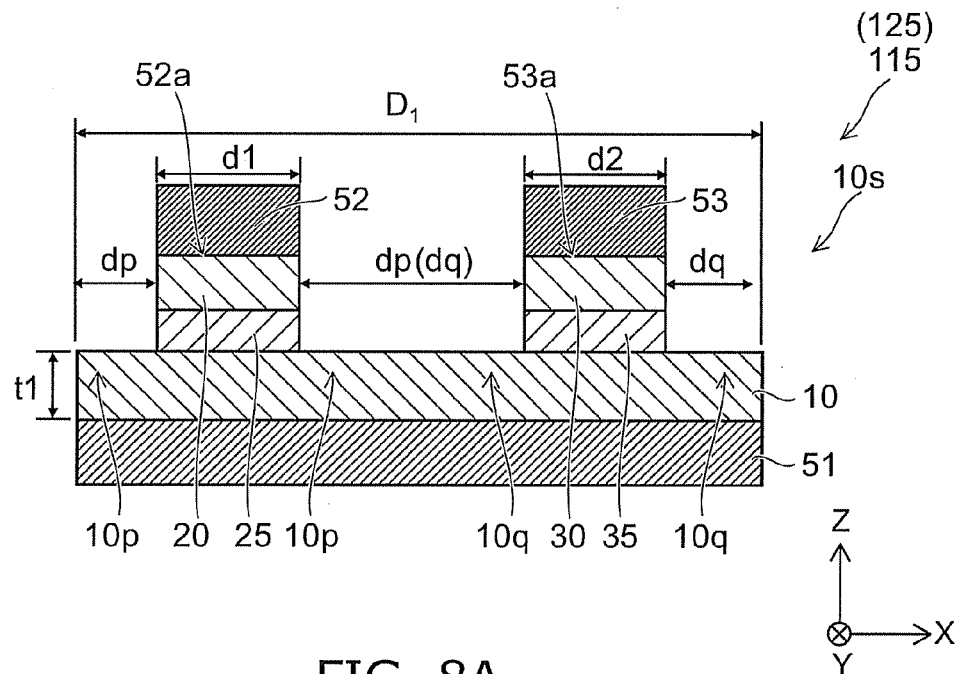
FIG. 8A, and FIG. 8B are schematic cross-sectional views illustrating the configurations of other magnetic oscillation elements according to the embodiment.
Figure 8B:
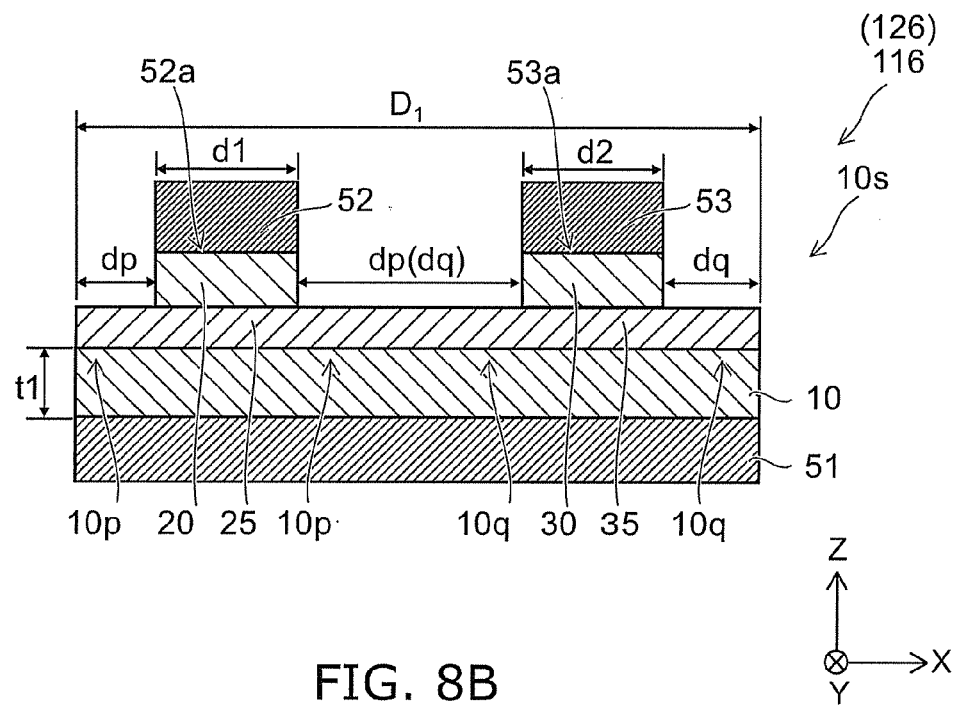

FIG. 7A to FIG. 7D, FIG. 8A, and FIG. 8B are schematic cross-sectional views illustrating the configurations of other magnetic oscillation elements according to the embodiment. FIG. 8A and FIG. 8B illustrate configurations of spin wave devices 125 and 126 described below.

In a magnetic oscillation element 111 according to the embodiment as illustrated in FIG. 7A, the stacked film 10s further includes an antiferromagnetic layer 21. The first magnetic layer 10 is disposed between the second magnetic layer 20 and the second electrode 52. The antiferromagnetic layer 21 is disposed between the second magnetic layer 20 and the first electrode 51. As described above, the magnetization direction of the second magnetic layer 20 is fixed by the antiferromagnetic layer 21.

In a magnetic oscillation element 112 according to the embodiment as illustrated in FIG. 7B, the first magnetic layer 10 is disposed between the second magnetic layer 20 and the first electrode 51. In this configuration, the first surface 52a of the second electrode contacting the stacked film 10s is the surface of the second electrode 52 that contacts the second magnetic layer 20.

In the magnetic oscillation element 112, the width of the second magnetic layer 20 along a direction (e.g., the X-axis direction) perpendicular to the Z-axis direction is smaller than the width of the first magnetic layer 10 along the same direction (e.g., the X-axis direction). In this example, in the Z-axis direction, the outer edge of the second magnetic layer 20 overlays the outer edge of the second electrode 52. In other words, in the axis perpendicular to the Z-axis direction, the width of the second magnetic layer 20 is the same as the width of the second electrode 52.

In the magnetic oscillation element 112, the distance between the first magnetic layer 10 and the second electrode 52 is greater than those of the magnetic oscillation elements 110 and 111. In such a case, as recited above, the width of the current flowing through the first magnetic layer 10 can be maintained at a small width by the width of the second magnetic layer 20 being smaller than the width of the first magnetic layer 10 (the first magnetic layer width $D_1$). Thereby, a high-frequency oscillation is obtained based on the mechanism described above.

For example, the manufacturing processes are easier when the second electrode 52 and the second magnetic layer 20 are patterned using the same mask.

In a magnetic oscillation element 113 according to the embodiment as illustrated in FIG. 7C, the width of the first spacer layer 25 of the configuration of the magnetic oscillation element 112 is reduced. In other words, the width of the first spacer layer 25 along the direction (e.g., the X-axis direction) perpendicular to the Z-axis direction is smaller than the width of the first magnetic layer 10 along the same direction (e.g., the X-axis direction). In this example, the outer edge of the first spacer layer 25 in the Z-axis direction overlays the outer edge of the second magnetic layer 20.

In the magnetic oscillation element 113 as well, the width of the current flowing through the first magnetic layer 10 can be maintained at a small width by the widths of the second magnetic layer 20 and the first spacer layer 25 being smaller than the width of the first magnetic layer 10 (the first magnetic layer width $D_1$). Thereby, a high-frequency oscillation is obtained based on the mechanism described above.

For example, the manufacturing processes are easier when the first spacer layer 25 and the second electrode 52 are patterned using the same mask. Further, the manufacturing processes are even easier when the second magnetic layer 20 is patterned using the same mask.

In a magnetic oscillation element 114 according to the embodiment as illustrated in FIG. 7D, the stacked film 10s further includes a third magnetic layer 30 and a second spacer layer 35. The third magnetic layer 30 is stacked along the first magnetic layer 10 and the Z-axis direction. In the third magnetic layer 30, the magnetization direction of the third magnetic layer 30 is fixed. The second spacer layer 35 is provided between the first magnetic layer 10 and the third magnetic layer 30 and is nonmagnetic. The first magnetic layer 10 is disposed between the second magnetic layer 20 and the third magnetic layer 30.

The magnetization direction of the third magnetic layer 30 is parallel to the magnetization direction of the second magnetic layer 20. The orientation of the magnetization of the third magnetic layer 30 is the same as the orientation of the magnetization of the second magnetic layer 20.

At least one selected from the second magnetic layer 20 and the third magnetic layer 30 may have a stacked structure including multiple ferromagnetic layers (e.g., the seventh magnetic layer 20a and the eighth magnetic layer 20b) and the nonmagnetic layer 20c provided between the multiple ferromagnetic layers. The thickness of the nonmagnetic layer 20c is not more than 5 nm.

In the case where the second magnetic layer 20 includes the multiple stacked ferromagnetic layers, the magnetization direction of the second magnetic layer 20 refers to the magnetization direction of the ferromagnetic layer (e.g., the eighth magnetic layer 20b) of the multiple ferromagnetic layers (e.g., the seventh magnetic layer 20a, the eighth magnetic layer 20b, etc.) included in the second magnetic layer 20 that is most proximal to the first spacer layer 25.

In the case where the third magnetic layer 30 includes the multiple stacked ferromagnetic layers, the magnetization direction of the third magnetic layer 30 refers to the magnetization direction of the ferromagnetic layer of the multiple ferromagnetic layers included in the third magnetic layer 30 that is most proximal to the second spacer layer 35.

For example, the magnetization direction of the ferromagnetic layer of the multiple ferromagnetic layers included in the second magnetic layer 20 that is most proximal to the first spacer layer 25 is parallel to the magnetization direction of the ferromagnetic layer of the multiple ferromagnetic layers included in the third magnetic layer 30 that is most proximal to the second spacer layer 35.

Because the magnetization direction of the second magnetic layer 20 is parallel to the magnetization direction of the third magnetic layer 30, the torque acting on the first magnetic layer 10 via the first spacer layer 25 by conducting the current between the electrodes has a direction reverse to that of the torque acting on the second magnetic layer 20 via the second spacer 35. Accordingly, the magnetization oscillation modes that changes in the thickness direction occurs easily in the first magnetic layer 10. Thereby, the magnetization oscillation occurs using even a small current.

In the magnetic oscillation elements 111 to 114 as well, the first thickness t1 of the first magnetic layer 10 is greater than 2 times the spin penetration depth Lsp of the first magnetic layer 10. The first thickness t1 is less than the first surface width d1 of the first surface 52a of the second electrode 52. When viewed along the Z-axis direction, the first magnetic layer 10 has the first edge portion 10p provided outside the first surface 52a; and the width dp of the first edge portion 10p is not less than the exchange length Lex of the first magnetic layer 10. Thereby, a high-frequency oscillation is obtained. Further, the Q factor also improves.

A magnetic oscillation element 115 according to the embodiment as illustrated in FIG. 8A further includes a third electrode 53. The third electrode 53 is connected to the stacked film 10s. The third electrode 53 is juxtaposed with the second electrode 52 in a direction intersecting the Z-axis direction. For example, the third electrode 53 is juxtaposed with the second electrode 52 in the X-Y plane.

The first magnetic layer 10 is disposed between the second magnetic layer 20 and the first electrode 51.

The stacked film 10s further includes the third magnetic layer 30 and the second spacer layer 35. The third magnetic layer 30 is provided between the first electrode 51 and the third electrode 53. In the third magnetic layer 30, the magnetization direction is fixed. The second spacer layer 35 is provided between the first magnetic layer 10 and the third magnetic layer 30.

In other words, the first magnetic layer 10 is provided on the first electrode 51; and the first spacer layer 25 is provided on a portion of the first magnetic layer 10. The second magnetic layer 20 is provided on the first spacer layer 25. The second electrode 52 is provided on the second magnetic layer 20. The second spacer layer 35 is provided on another portion of the first magnetic layer 10. The third magnetic layer 30 is provided on the second spacer layer 35. The third electrode 53 is provided on the third magnetic layer 30.

Thus, multiple spacer layers may be provided in one first magnetic layer 10. Fixed magnetic layers (the second magnetic layer 20, the third magnetic layer 30, etc.) may be provided in each of the multiple spacer layers. Electrodes (the second electrode 52, the third electrode 53, etc.) may be provided in each of the multiple fixed magnetic layers.

In a magnetic oscillation element 116 according to the embodiment as illustrated in FIG. 8B, the second spacer layer 35 is continuous from the first spacer layer 25. Or, the first spacer layer 25 may be considered to extend between the first magnetic layer 10 and the third magnetic layer 30. Otherwise, the configuration is similar to that of the magnetic oscillation element 115.

The configurations and the materials described in regard to, for example, the second electrode 52 can be applied to the third electrode 53. The configurations and the materials described in regard to, for example, the second magnetic layer 20 can be applied to the third magnetic layer 30. The configurations and the materials described in regard to, for example, the first spacer layer 25 can be applied to the second spacer layer 35.

In the magnetic oscillation elements 115 and 116 as well, the first thickness t1 of the first magnetic layer 10 is greater than 2 times the spin penetration depth Lsp of the first magnetic layer 10. The first thickness t1 is less than the first surface width d1 of the first surface 52a of the second electrode 52. When viewed along the Z-axis direction, the first magnetic layer 10 has the first edge portion 10p provided outside the first surface 52a; and the width dp of the first edge portion 10p is not less than the exchange length Lex of the first magnetic layer 10.

Moreover, the thickness of the first magnetic layer 10 (the first thickness t1) is less than the maximum width of a second surface 53a (a second surface width d2) of the third electrode 53 that contacts the stacked film 10s. The first magnetic layer 10 has a second edge portion 10q provided outside the second surface 53a when viewed along the Z-axis direction. When viewed along the Z-axis direction, the width dq of the second edge portion 10q in the direction perpendicular to a tangent of the edge of the second surface 53a is not less than the exchange length Lex of the first magnetic layer 10.

Thereby, a high-frequency oscillation is obtained. Further, the Q factor also improves.

In the magnetic oscillation elements 115 and 116, the multiple fixed magnetic layers (the second magnetic layer 20, the third magnetic layer 30, etc.) are provided in one first magnetic layer 10. Thereby, for example, the oscillation characteristic is stabilized. For example, the Q factor of the oscillation frequency improves.

In the magnetic oscillation elements 115 and 116, for example, the third electrode 53 can be used for output voltage extraction while using the second electrode 52 for current injection into the stacked film 10s.

An example of the magnetic oscillation element 111 will now be described as a specific example of the configuration of the magnetic oscillation element according to the embodiment. The planar size of the first magnetic layer 10 (the size when viewed along the Z axis) is, for example, 120 nm×150 nm. The planar size of the second electrode 52 is, for example, 40 nm×40 nm.

The first electrode 51 may include, for example, a Cu layer. The antiferromagnetic layer 21 may include, for example, an InMn layer having a thickness of 15 nm. The second magnetic layer 20 may include, for example, an FeCo layer having a thickness of 20 nm. The first spacer layer 25 may include, for example, a MgO layer of 0.9 nm. The first magnetic layer 10 may include a permalloy layer having a thickness of 10 nm. The second electrode 52 may include, for example, a Cu layer.

The magnetic oscillation element 111 is constructed, for example, using sputtering and lithography. An example of a method for manufacturing the magnetic oscillation element 111 will now be described.

The first electrode 51 is formed on a wafer. A film used to form the antiferromagnetic layer 21, a film used to form the second magnetic layer 20, a film used to form the first spacer layer 25, and a film used to form the first magnetic layer 10 are stacked in this order on the first electrode 51 using, for example, an ultra-high vacuum sputtering apparatus. A protective film is further stacked on these films. The wafer is annealed, for example, in a magnetic field for 10 hours at 270° C. in a vacuum oven. Thereby, the film used to form the second magnetic layer 20 is provided with unidirectional isotropy. Subsequently, a resist is coated onto the protective film; and a mask corresponding to the planar configurations of the elements is formed by EB (Electron Beam) exposure. The films recited above in regions not covered with the mask are etched using, for example, ion milling. Thereby, the multiple elements are formed. After the etching, the mask is peeled. Then, a $SiO_2$ film is formed between the multiple elements using ultra-high vacuum sputtering. Subsequently, smoothing of the front surface using ion milling is performed to expose the front surfaces of the elements. A film used to form the second electrode 52 is formed on each of the elements. Thereby, the magnetic oscillation elements 111 are formed.

Figure 9A:
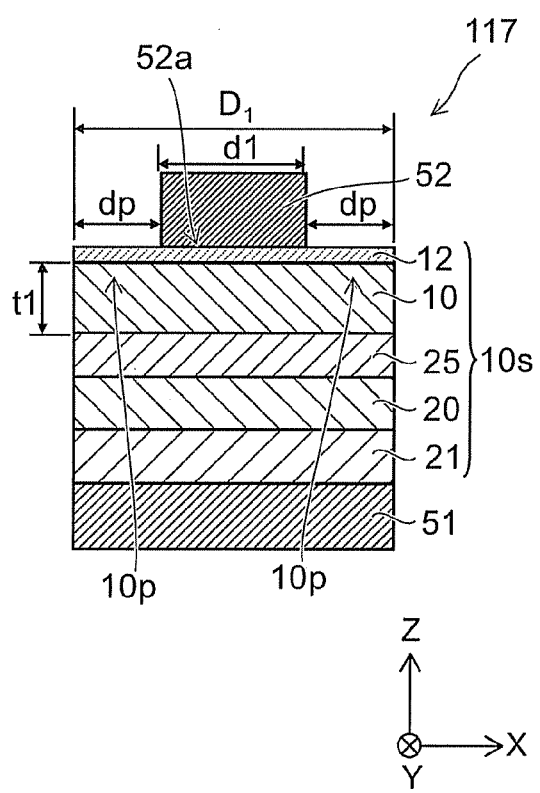
FIG. 9A and FIG. 9B are schematic cross-sectional views illustrating the configurations of other magnetic oscillation elements according to the embodiment.
Figure 9B:
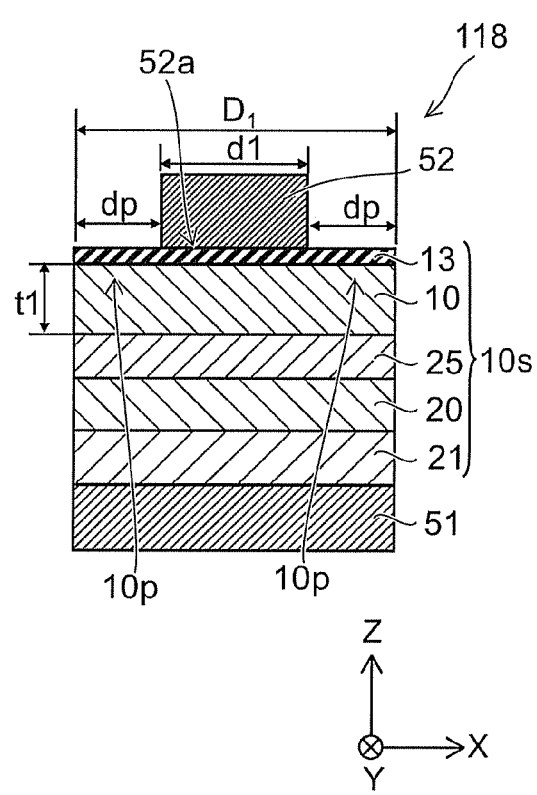

FIG. 9A and FIG. 9B are schematic cross-sectional views illustrating the configurations of other magnetic oscillation elements according to the embodiment.

As illustrated in FIG. 9A, the magnetic oscillation element 117 according to the embodiment also includes the first electrode 51, the second electrode 52, and the stacked film 10s. The stacked film 10s is provided between the first electrode 51 and the second electrode 52.

In the magnetic oscillation element 117, the stacked film 10s includes the first magnetic layer 10, the second magnetic layer 20, and the first spacer layer 25. The second magnetic layer 20 is provided between the first magnetic layer 10 and the first electrode 51.

The stacked film 10s further includes a cap layer 12. The cap layer 12 is provided between the first magnetic layer 10 and the second electrode 52. The thickness of the cap layer 12 (the length along the Z-axis direction) is not more than 10 nm. The cap layer 12 is nonmagnetic.

In such a case as well, the first thickness t1 of the first magnetic layer 10 is greater than 2 times the spin penetration depth Lsp of the first magnetic layer 10. The first thickness t1 is less than the first surface width d1 of the first surface 52a of the second electrode 52. When viewed along the Z-axis direction, the first magnetic layer 10 has the first edge portion 10p provided outside the first surface 52a; and the width dp of the first edge portion 10p is not less than the exchange length Lex of the first magnetic layer 10.

The cap layer 12 covers, for example, the surface of the first magnetic layer 10 on the second electrode 52 side. The cap layer 12 has a function of protecting the first magnetic layer 10. The cap layer 12 may include, for example, tantalum (Ta), ruthenium (Ru), copper (Cu), etc. Thus, the cap layer 12 may be conductive.

A current flows in the first magnetic layer 10 via the cap layer 12. The thickness of the cap layer 12 is sufficiently thin such that the width of the current flowing in the first magnetic layer 10 does not spread. In the case where the thickness of the cap layer 12 is thicker than 5 nm, the width of the current flowing in the first magnetic layer 10 spreads excessively; and a high-frequency oscillation cannot be obtained stably. The spread of the current path can be suppressed by the thickness of the cap layer 12 being not more than 5 nm.

In a magnetic oscillation element 118 according to the embodiment as well, a cap layer 13 is provided in the stacked film 10s as illustrated in FIG. 9B. In such a case, the cap layer 13 includes an insulative material. The current flows into the first magnetic layer 10 via the cap layer 13 due to, for example, tunneling by the thickness of the cap layer 13 being sufficiently thin.

The magnetic oscillation element according to this embodiment may be used in, for example, microwave/millimeter wave band wireless communication devices, radar devices, etc. However, the embodiment is not limited thereto. The applications of the magnetic oscillation element are arbitrary.

In this embodiment as well, the first magnetic layer 10 and the second magnetic layer 20 may have stacked structures of multiple layers. In the case where, for example, the first magnetic layer 10 has such a stacked structure, the substantial spin penetration depth of the first magnetic layer 10 is equal to the layer thickness of the magnetic layer of the magnetic layers recited above that is most proximal to the spacer layer because the spin-polarized component of the electron current is lost at the interface with the adjacent magnetic layer. Accordingly, in such a case, a high oscillation frequency is obtained by the thickness of the first magnetic layer 10 being not less than 2 times the thickness of the magnetic layer of the multiple magnetic layers that is most proximal to the spacer layer (the first spacer layer 25). Therefore, it is notable that, for example, by the thickness of this magnetic layer being thin, the mode of the magnetization 11 along the thickness direction having different phases (e.g., the out-of-phase mode described in regard to FIG. 4A and FIG. 4B) occurs even in the case where the thickness of the first magnetic layer 10 is thin.

As an example, in the case where the first magnetic layer 10 has a stacked structure of a 2 nm magnetic layer of FeCo and a 2.2 nm magnetic layer of permalloy, a high-frequency magnetization oscillation is obtained for the first magnetic layer 10 having a thickness of 4.2 nm as an entirety. This means that a high-frequency magnetization oscillation is obtained when the first magnetic layer 10 has a layer thickness thinner than that of the case of a single layer of FeCo. It is notable that, for example, the current value necessary for the oscillation decreases as the thickness of the first magnetic layer 10 decreases. In this configuration as well, the conditions regarding the width of the second electrode 52, etc., are similar to those of the embodiment recited above. In other words, the maximum width of the first surface 52a of the second electrode 52 is greater than the thickness of the first magnetic layer 10. The width of the first edge portion 10p of the first magnetic layer 10 is not less than the exchange length of the first magnetic layer 10. Herein, the exchange length of the first magnetic layer 10 means the exchange length of the magnetic layer of the magnetic layers included in the first magnetic layer 10 that is most proximal to the spacer layer. In this example as well, a high-frequency magnetization oscillation is stably obtained because the closure domains due to the current-produced magnetic field can be suppressed when the width of the second electrode 52 is not more than 100 nm and more notably when not more than 50 nm.

Second Embodiment

The second embodiment is a spin wave device. For example, the configurations of the magnetic oscillation elements described in regard to FIG. 8A and FIG. 8B can be applied to the spin wave devices according to the embodiment.

Namely, as illustrated in FIG. 8A, the spin wave device 125 according to the embodiment includes the first electrode 51, the second electrode 52, the third electrode 53, and the stacked film 10s.

The third electrode 53 is juxtaposed with the second electrode 52. The stacked film 10s is provided between the first electrode 51 and the second electrode 52 and between the first electrode 51 and the third electrode 53.

The stacked film 10s includes the first magnetic layer 10, the second magnetic layer 20, the first spacer layer 25, the third magnetic layer 30, and the second spacer layer 35. The magnetization direction of the first magnetic layer 10 is variable. The second magnetic layer 20 is provided between the first magnetic layer 10 and the second electrode 52; and the magnetization direction of the second magnetic layer 20 is fixed. The first spacer layer 25 is provided between the first magnetic layer 10 and the second magnetic layer 20 and is nonmagnetic. The third magnetic layer 30 is provided between the first magnetic layer 10 and the third electrode 53; and the magnetization direction of the third magnetic layer 30 is fixed. The second spacer layer 35 is provided between the first magnetic layer 10 and the third magnetic layer 30 and is nonmagnetic.

In such a case as well, the thickness of the first magnetic layer 10 (the first thickness t1) along the Z-axis direction connecting the first electrode 51 and the second electrode 52 is greater than 2 times the spin penetration depth Lsp of the first magnetic layer 10. The first thickness t1 is less than the maximum width of the first surface 52a (the first surface width d1) of the second electrode 52 that contacts the stacked film 10s. The first magnetic layer 10 has the first edge portion 10p provided outside the first surface 52a when viewed along the Z-axis direction; and the width dp of the first edge portion 10p in the direction perpendicular to the tangent of the edge of the first surface 52a is not less than the exchange length Lex of the first magnetic layer 10 when viewed along the Z-axis direction.

As in the spin wave device 126 illustrated in FIG. 8B, in the embodiment, the second spacer layer 35 may be continuous with the first spacer layer 25.

In the spin wave devices according to this embodiment (e.g., the spin wave devices 125 and 126 and modifications of the spin wave devices 125 and 126), for example, the third electrode 53 can be used to extract the output voltage while using the second electrode 52 for current injection into the stacked film 10s. For example, the change of the resistance can be extracted based on a GMR effect, a TMR effect, etc., when extracting the voltage between the first electrode 51 and the third electrode 53.

For example, the second electrode 52 and the third electrode 53 may be multiply provided.

The spin wave devices 125 and 126 according to the embodiment and spin wave devices of modifications of the spin wave devices 125 and 126 can be applied to, for example, adders, etc. According to the embodiment, a high-frequency oscillation is obtained and high-speed operations are possible. Also, batch processing of multiple inputs is possible.

In this embodiment, the width of the second magnetic layer 20 along the X-axis direction is smaller than the width of the first magnetic layer 10 along the X-axis direction. In particular, it is notable when the outer edge of the second magnetic layer 20 when viewed along the Z-axis direction and the outer edge of the second electrode 52 when viewed along the Z-axis direction overlay each other when viewed along the Z-axis direction.

In the spin wave device 126, the width of the first spacer layer 25 along the X-axis direction is narrower than the width of the first magnetic layer 10 along the X-axis direction. In particular, it is notable when the outer edge of the first spacer layer 25 when viewed along the Z-axis direction and the outer edge of the second magnetic layer 20 when viewed along the Z-axis direction overlay each other when viewed along the Z-axis direction.

For example, the first thickness t1 of the first magnetic layer 10 is less than the width of the second surface 53a (the second surface width d2) of the third electrode 53 that contacts the stacked film 10s. The first magnetic layer 10 has the second edge portion 10q provided outside the second surface 53a when viewed along the Z-axis direction; and the width dq of the second edge portion 10q in the direction perpendicular to the tangent of the edge of the second surface 53a when viewed along the Z-axis direction is not less than the exchange length Lex of the first magnetic layer 10.

In the embodiments recited above, it is unnecessary for the first magnetic layer 10, the second magnetic layer 20, and the first spacer layer 25 to have the same configurations or sizes; and the configurations and sizes may be different from each other.

From the aspect of the manufacturing process, it is notable when the planar configuration of the first magnetic layer 10 has a vertical:horizontal ratio within the range of 1:1 to 1:4. However, the planar configuration of the first magnetic layer 10 may have any configuration such as square, rectangular, polygonal (e.g., hexagonal), circular, elliptical, diamond-shaped, parallelogram-shaped, etc.

Each of the components included in the magnetic oscillation elements and the spin wave device according to the embodiments such as the antiferromagnetic layers, the spacer layers, the insulating layers, etc., may be single layers or may have structures in which two or more layers are stacked.

The vertical relationship of the structures of the magnetic oscillation element and the spin wave device according to the embodiments are arbitrary. The vertical relationship of the structures may or may not match the vertical relationships of the drawings attached to the specification of the application.

According to the embodiments, a magnetic oscillation element and a spin wave device are provided in which a high-frequency oscillation is obtained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, the embodiments of the invention are described with reference to specific examples. However, the embodiments of the invention are not limited to these specific examples. For example, one skilled in the art may similarly practice the invention by appropriately selecting specific configurations of components included in magnetic oscillation elements and spin wave devices such as electrodes, stacked films, magnetic layers, spacer layers, antiferromagnetic layers, cap layers, etc., from known art. Such practice is included in the scope of the invention to the extent that similar effects are obtained.

Further, any two or more components of the specific examples may be combined within the extent of technical feasibility and are included in the scope of the embodiments to the extent that the spirit of the embodiments is included.

Moreover, all magnetic oscillation elements and spin wave devices practicable by an appropriate design modification by one skilled in the art based on the magnetic oscillation elements and the spin wave devices described above as embodiments of the invention also are within the scope of the invention to the extent that the spirit of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic oscillation element, comprising:
   a first electrode;
   a second electrode;
   a first magnetic layer provided between the first electrode and the second electrode, the first magnetic layer having a variable magnetization direction;
   a second magnetic layer provided between the first electrode and the first magnetic layer, the second magnetic layer having a fixed magnetization direction; and
   a first spacer layer being nonmagnetic and provided between the first magnetic layer and the second magnetic layer,
   the first magnetic layer including:
      a ferromagnetic fourth magnetic layer; and
      a ferromagnetic fifth magnetic layer contacting the first spacer layer between the fourth magnetic layer and the first spacer layer,
   a thickness of the first magnetic layer in a first direction connecting the first electrode and the second electrode being greater than 2 times a thickness of the fifth magnetic layer in the first direction,
   the thickness of the first magnetic layer being less than a maximum width of a first surface of the second electrode on the first magnetic layer side,
   the first magnetic layer having a first edge portion provided outside the first surface when viewed along the first direction, a width of the first edge portion in a direction perpendicular to a tangent of an edge of the first surface being not less than an exchange length of the fifth magnetic layer.

2. The element according to claim 1, wherein the maximum width of the first surface is not more than 100 nanometers.

3. The element according to claim 1, wherein the fifth magnetic layer includes an alloy including at least one selected from the group consisting of Fe, Co, and Ni or an alloy including at least one selected from the group consisting of Fe, Co, Ni, Mn, and Cr.

4. The element according to claim 1, further comprising an antiferromagnetic layer provided between the second magnetic layer and the first electrode.

5. The element according to claim 1, further comprising:
   a third magnetic layer provided between the first magnetic layer and the second electrode, the third magnetic layer having a fixed magnetization direction in a direction parallel to the magnetization direction of the second magnetic layer; and
   a second spacer layer being nonmagnetic and provided between the first magnetic layer and the third magnetic layer.

6. The element according to claim 1, wherein:
   a magnetization of the first magnetic layer oscillates when a current is caused to flow between the first electrode and the second electrode;
   the first magnetic layer has a first portion on the first electrode side and a second portion on the second electrode side; and
   a phase of the oscillation of the magnetization of the first portion is different from a phase of the oscillation of the magnetization of the second portion.

7. The element according to claim 1, wherein a current is conducted from the first magnetic layer toward the second magnetic layer via the first electrode and the second electrode.

8. The element according to claim 1, wherein at least one selected from the first magnetic layer and the second magnetic layer includes an alloy including at least one element selected from the group consisting of Fe, Co, Ni, Mn, and Cr and at least one element selected from the group consisting of Pt, Pd, Ir, Ru, and Rh.

9. The element according to claim 7, wherein
a minimum thickness of the first magnetic layer in a first direction connecting the first electrode and the second electrode is greater than 2 times a thickness of the fifth magnetic layer in the first direction,
a maximum thickness of the first magnetic layer is less than a maximum width of a first surface of the second electrode on the first magnetic layer side.

* * * * *